(12) United States Patent
Welland et al.

(10) Patent No.: US 7,209,011 B2
(45) Date of Patent: Apr. 24, 2007

(54) METHOD AND APPARATUS FOR SYNTHESIZING HIGH-FREQUENCY SIGNALS FOR WIRELESS COMMUNICATIONS

(75) Inventors: David R. Welland, Austin, TX (US); John B. Pavelka, Austin, TX (US); Edmund G. Healy, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 150 days.

(21) Appl. No.: 11/146,337

(22) Filed: Jun. 6, 2005

(65) Prior Publication Data

US 2005/0242897 A1   Nov. 3, 2005

Related U.S. Application Data

(63) Continuation of application No. 10/081,730, filed on Feb. 22, 2002, now Pat. No. 6,903,617, which is a continuation-in-part of application No. 09/999,702, filed on Oct. 31, 2001, now abandoned, which is a continuation of application No. 09/579,151, filed on May 25, 2000, now Pat. No. 6,323,735, application No. 11/146,337, which is a continuation-in-part of application No. 10/075,094, filed on Feb. 13, 2002, now abandoned, and a continuation-in-part of application No. 10/075,098, filed on Feb. 13, 2002, now Pat. No. 7,092,675, and a continuation-in-part of application No. 10/074,591, filed on Feb. 13, 2002, now Pat. No. 6,993,314.

(51) Int. Cl.
 *H01L 21/60* (2006.01)
(52) U.S. Cl. ............................. 331/36 L; 331/108 C; 257/531; 438/238
(58) Field of Classification Search ........... 331/108 C, 331/36 L; 257/531; 438/238
See application file for complete search history.

(56) References Cited

U.S. PATENT DOCUMENTS 6,323,735 B1 * 11/2001 Welland et al. ........... 331/36 L \* cited by examiner

*Primary Examiner*—Arnold Kinkead
(74) *Attorney, Agent, or Firm*—O'Keefe, Egan, Peterman, Enders LLP

(57) ABSTRACT

A semiconductor package includes a package substrate and an integrated circuit. The package substrate has a first surface. The integrated circuit couples electrically to the first surface of the package substrate. The integrated circuit and the package substrate together form the semiconductor package. The semiconductor package also includes a first inductance circuit and a second inductance circuit, both formed within the semiconductor package. The first and second inductance circuits couple to each other in parallel. The first and second inductance circuits have substantially symmetrical geometric characteristics.

25 Claims, 18 Drawing Sheets

METHOD AND APPARATUS FOR SYNTHESIZING HIGH-FREQUENCY SIGNALS FOR WIRELESS COMMUNICATIONS

CROSS-REFERENCE TO RELATED PATENT DOCUMENTS

This patent application is a continuation application of U.S. patent application Ser. No. 10/081,730, titled "Method And Apparatus For Synthesizing High-Frequency Signals For Wireless Communications," filed on Feb. 22, 2002, now issued as U.S. Pat. No. 6,903,617, which is a continuation-in-part application of U.S. patent application Ser. No. 09/999,702, titled "Method and Apparatus for Synthesizing Dual Band High-Frequency Signals for Wireless Communications," filed on Oct. 31, 2001, now abandoned, which is a continuation application of U.S. patent application Ser. No. 09/579,151, titled "Method and Apparatus for Synthesizing Dual Band High-Frequency Signals for Wireless Communications," filed on May 25, 2000, now issued as U.S. Pat. No. 6,323,735.

This patent application is a continuation-in-part of, and incorporates by reference, the following patent documents: U.S. patent application Ser. No. 10/075,094 filed Feb. 13, 2002, titled "Radio-Frequency Communication Apparatus and Associated Methods", now abandoned; U.S. patent application Ser. No. 10/075,098 filed Feb. 13, 2002, titled "Apparatus and Methods for Generating Radio Frequencies in Communication Circuitry", now issued as U.S. Pat. No. 7,092,675; and U.S. patent application Ser. No. 10/074,591 filed Feb. 13, 2002, titled "Apparatus for Generating Multiple Radio Frequencies in Communication Circuitry and Associated Methods", now issued as U.S. Pat. No. 6,993,314.

Furthermore, this patent application incorporates by reference the following patent documents: U.S. patent application Ser. No. 10/075,122, titled "Digital Architecture for Radio-Frequency Apparatus and Associated Methods", now issued as U.S. Pat. No. 6,970,717; U.S. patent application Ser. No. 10/075,099, titled "Notch Filter for DC Offset Reduction in Radio-Frequency Apparatus and Associated Methods", now issued as U.S. Pat. No. 7,024,221; U.S. patent application Ser. No. 10/074,676, titled "DC Offset Reduction in Radio-Frequency Apparatus and Associated Methods"; U.S. patent application Ser. No. 10/079,058, titled "Apparatus and Methods for Output Buffer Circuitry with Constant Output Power in Radio-Frequency Circuitry", now issued as U.S. Pat. No. 7,138,858; U.S. patent application Ser. No. 10/081,121, titled "Calibrated Low-Noise Current and Voltage References and Associated Methods"; and U.S. patent application Ser. No. 10/079,057, titled "Apparatus and Method for Front-End Circuitry in Radio-Frequency Apparatus", now issued as U.S. Pat. No. 7,035,611.

TECHNICAL FIELD OF THE INVENTION

The present invention relates generally to the synthesis of high-frequency signals. More particularly, the present invention relates to the synthesis of high-frequency local oscillator signals for wireless communication applications.

BACKGROUND

Wireless communication systems typically require frequency synthesis in both the receive path circuitry and the transmit path circuitry. For example, cellular phone standards in the United States and Europe define a cellular telephone system with communication centered in two frequency bands at about 900 MHz and 1800 MHz. For example, United States cellular phone standards include (1) the AMPS (analog), IS-54 (analog/digital), and IS-95 (analog/digital) standards in the 900 MHz frequency band, and (2) PCS (digital) standards in the 1800 MHz range. European cellular phone standards include (1) the TACS (analog) and GSM (digital) standards in the 900 MHz frequency band, and (2) the DCS1800 (digital) standard in the 1800 MHz range. A dual band cellular phone is capable of operating in both the 900 MHz frequency band and the 1800 MHz frequency band.

Within the frequency bands, the cellular standards define systems in which base station units and mobile units communicate through multiple channels, such as 30 kHz (IS-54) or 200 kHz (GSM) wide channels. For example, with the IS-54 standard, approximately 800 channels are used for transmitting information from the base station to the mobile unit, and another approximately 800 channels are used for transmitting information from the mobile unit to the base station. A frequency band of 869–894 MHz and a frequency band of 824–849 MHz are reserved for these channels, respectively. Because the mobile unit must be capable of transmitting and receiving on any of the channels for the standard within which it is operating, a frequency synthesizer must be provided to create accurate frequency signals in increments of the particular channel widths, such as for example 30 kHz increments in the 800–900 MHz region.

Phase-locked loop ("PLL") circuits including voltage controlled oscillators ("VCOs") are often used in mobile unit applications to produce the desired output frequency ($f_{OUT}$). The output frequency may be made programmable by utilizing an output frequency feedback divider ($\div N$) and a reference divider ($\div R$) for an input reference frequency ($f_{REF}$). The output frequency produced is a function of the values selected for "N" and "R" in the divider circuits, such that $f_{OUT}=N(f_{REF}/R)$. The PLL circuitry typically utilizes a phase detector to monitor phase differences ($\Delta\theta$) between the divided reference frequency ($f_{REF}/R$) and the divided output frequency ($f_{OUT}/N$) to drive a charge pump. The charge pump delivers packets of charge proportional to the phase difference ($\Delta\theta$) to a loop filter. The loop filter outputs a voltage that is connected to the VCO to control its output frequency. The action of this feedback loop attempts to drive the phase difference ($\Delta\theta$) to zero (or at least to a constant value) to provide a stable and programmable output frequency.

The values for the reference frequency and the divider circuits may be chosen depending upon the standard under which the mobile unit is operating. For example, within the United States IS-54 system, a PLL could be built such that $f_{REF}/R=30$ kHz and such that N is on the order of 30,000. The output frequency, therefore, could then be set in 30 kHz increments to frequencies in the 900 MHz frequency band. Similarly, within the European GSM system, a PLL could be built such that $f_{REF}/R=200$ kHz and such that N is on the order of 4,500. The output frequency, therefore, could then be set in 200 kHz increments to frequencies in the 900 MHz frequency band.

The performance of the communication system, however, is critically dependent oh the purity of the synthesized high-frequency output signals. For signal reception, impure frequency sources result in mixing of undesired channels into the desired channel signal. For signal transmission, impure frequency sources create interference in neighboring channels. A frequency synthesizer, therefore, must typically meet very stringent requirements for spectral purity. The level of spectral purity required in cellular telephone applications makes the design of a PLL synthesizer solution and, in particular, the design of a VCO within a PLL synthesizer solution quite demanding.

Three types of spectral impurity will typically occur in VCO circuits that are used in PLL implementations for frequency synthesis: harmonic distortion terms associated with output frequency, spurious tones near the output frequency, and phase noise centered on the output frequency. Generally, harmonic distortion terms are not too troublesome because they occur far from the desired fundamental and their effects may be eliminated in cellular phone circuitry external to the frequency synthesizer. Spurious tones, however, often fall close to the fundamental. In particular, spurious tones at frequencies of $\pm f_{REF}/R$ from the output frequency ($f_{OUT}$) are often found in the output frequency spectrum. These are called reference tones. Spurious tones, including reference tones, may be required by a cellular phone application to be less than about −70 dBc, while harmonic distortion terms may only be required to be less than about −20 dBc. It is noted that the "c" indicates the quantity as measured relative to the power of the "carrier" frequency, which is the output frequency.

Phase noise is undesired energy spread continuously in the vicinity of the output frequency, invariably possessing a higher power density at frequencies closer to the fundamental of the output frequency. Phase noise is often expressed as dBc/$\sqrt{Hz}$ or dBc/Hz. Phase noise is often the most damaging of the three to the spectral purity of the output frequency. Because of the effect phase noise has on system performance, a typical cellular application might require the frequency synthesizer to produce an output frequency having phase noise of less than about −110 dBc/$\sqrt{Hz}$ at 100 kHz from the output frequency.

Because the phase noise specifications are so stringent in cellular phone applications, the VCOs used in cellular phone PLL synthesizer solutions are typically based on some resonant structure. Ceramic resonators and LC tank circuits are common examples. While details in the implementation of LC tank oscillators differ, the general resonant structure includes an inductor (L) connected in parallel with a fixed capacitor (C) and a variable capacitor ($C_X$). In the absence of any losses, energy would slosh between the capacitors and the inductor at a frequency $f_{OUT}=(1/2\pi)[L(C+C_X)]^{-1/2}$. Because energy will be dissipated in any real oscillator, power in the form of a negative conductance source, such as an amplifier, is applied to maintain the oscillation. It is often the case that the series resistance of the inductor is the dominant loss mechanism in an LC tank oscillator, although other losses typically exist.

Though the frequency synthesizer may be generally contained within an integrated circuit package, VCO inductors used for band selection purposes are "off-package" or circuit board-mounted, and connected with other package-contained PLL circuitry to form a frequency synthesizer circuit by means of contacts or pin connections. Off-package inductors are often mounted on a circuit board by the board or PC manufacturer. The use of off-package or board mounted inductors increases system costs and connection problems may occur at pin connections between the package and a board, adversely affecting reliability and/or performance of the PLL circuitry.

SUMMARY OF THE INVENTION

In accordance with the present invention, a method and apparatus for synthesizing high-frequency signals is disclosed that utilizes on-package oscillator circuit inductors for band selection purposes, thus simplifying circuitry and reducing costs associated with assembly of PLL circuitry. In one embodiment, no external package connection (e.g., package connector pins, package substrate solder bumps, etc.) exists to connect off-package or external inductors (e.g., inductors on printed circuit boards, etc.) to on-package (or within the package) band selection VCO inductance circuits. Advantageously, multiple package electrical connection points may also be provided on-package to allow for selection of alternate oscillator inductance values during package assembly. This increases manufacturing flexibility by allowing manufacture of PLL package circuitry having different hardwired inductance values, using the same package substrate components.

Oscillator circuit inductors that may be provided on-package using the disclosed method and apparatus include inductors associated with oscillator circuits used to produce output frequencies for mixing with RF and/or IF signals. For example, one or more IF-mixing related inductors of a frequency synthesizer may be provided off-package, while one or more RF-mixing related inductors of the frequency synthesizer may be provided on-package, and vice-versa. Furthermore, as many or as few RF-mixing related and/or IF-mixing related inductors of frequency synthesizer may be provided on-package as desired, advantageously allowing for provision of a frequency synthesizer that may be wholly contained in a single package, including all RF-mixing related and IF-mixing related inductors. As a further advantage, the disclosed on-package frequency synthesizer circuitry may be included with other on-package circuitry, for example, allowing provision of a complete transceiver on-package.

Using the disclosed method and apparatus, one or more on-package inductors may be provided for connection with one or more VCO circuits disposed in or within an integrated circuit attached to a package substrate. In addition, alternative package substrate and/or integrated circuit electrical connection points corresponding to one or more of such inductance circuits may be provided to allow different electrical connection points to be selected during package assembly in order to achieve correspondingly different inductance values for connection with one or more of such VCO circuits. The inductance values may be varied in a number of ways including, but not limited to, by varying the length, geometry (e.g., cross section, winding, etc.) and/or material of a conductive feature that is included in a VCO circuit by virtue of package substrate and/or integrated circuit electrical connection points selected for connection during package assembly. Advantageously, provision of alternative inductance values for selectable inclusion in one or more VCO circuits may be used to allow different induction values to be selected for different products utilizing the same integrated circuit and/or package substrate, and/or to allow VCO inductance values to be optimized on a component-by-component basis, e.g., based on individual package testing or on a product line basis based on optimization during product testing.

In one embodiment, provision for two or more different on-package VCO inductance values may be provided by incorporation of multiple electrical connection points on or within a package substrate. During package assembly, one or more of the predetermined VCO inductance values may be incorporated into a PLL circuit by connecting VCO integrated circuitry to the appropriate package substrate electrical connection points. In this regard, different inductance values may be provided by inductors incorporated on or within a package substrate, and/or incorporated into electrical connections between an integrated circuit and the selected package electrical connection points. Selection of desired VCO inductance value may be made prior to assembly or during the assembly process. For example, package substrates may be provided with two or more alternative electrical connection points corresponding to different VCO inductance values that are envisioned for a product. These values may correspond to two or more possible VCO inductance values for a new product, allowing prototype circuitry to be manufactured having provision for different VCO inductance values for evaluation and testing purposes, before a decision is made on the desired VCO inductance value to be incorporated in final product circuitry. In such a case, prototype PLL circuits having different VCO inductance values and the final product may advantageously be manufactured using the same package substrate and integrated circuit design configuration.

Alternatively, two or more final products with PLL circuitry having different VCO inductance values may be manufactured using the same package substrate by connecting to appropriate alternative package electrical contacts to provide the desired VCO inductance value for each respective product. As a further alternative, VCO inductance values may be selected for inclusion in a PLL circuit on an individual package-by-package product basis during package assembly by connecting to different alternative package electrical contacts. For example, an appropriate VCO inductance value for a PLL circuit in an individual package may be selected based on the individual characteristics of the circuitry in the particular package, e.g., based on testing during assembly.

The disclosed on-package band selection inductance values may be advantageously employed with a variety of different PLL circuitry configurations, for example in one embodiment with a phase-locked loop (PLL) frequency synthesizer having a variable capacitance voltage controlled oscillator (VCO) that includes a discretely variable capacitance in conjunction with a continuously variable capacitance. In such a case, the discretely variable capacitance may provide coarse tuning adjustment of the variable capacitance to compensate for capacitor and inductor tolerances and to adjust the output frequency to be near the desired output frequency. The continuously variable capacitance may provide a fine tuning adjustment of the variable capacitance to focus the output frequency to match precisely the desired output frequency and to provide compensation for post-calibration drift of the PLL circuitry. In such an embodiment, the need for a traditional varactor implementation in the VCO and need for traditional large capacitor component in the loop filter are avoided, thereby providing a high-frequency frequency synthesizer that may be contained in a single package.

In one respect, disclosed is a semiconductor package including: a package substrate having a first surface; an integrated circuit electrically connected to the first surface of the package substrate, the integrated circuit and the package substrate together forming the semiconductor package, the integrated circuit and package substrate including frequency synthesizer circuitry; and at least one inductance circuit formed entirely within the semiconductor package and formed at least partially between the integrated circuit and the package substrate, the inductance circuit at least in part determining an output frequency for the frequency synthesizer circuitry.

In another respect, disclosed is a frequency synthesizer for generating output signals in at least one band of frequency, including: a package substrate having a plurality of substrate electrical contacts disposed on a first surface thereof; and an integrated circuit structurally connected to the first surface of the package substrate and having a plurality of integrated circuit electrical contacts disposed on a surface thereof. The integrated circuit and the package substrate together form the frequency synthesizer including: a frequency circuit having an output frequency operable within at least one frequency band; and a controlled oscillator circuit within the phase locked loop circuit, the controlled oscillator circuit being operable within the at least one frequency band and the output frequency being dependent upon the controlled oscillator circuit; wherein the controlled oscillator circuit has at least one inductance circuit formed at least partially between the integrated circuit and the package substrate, the inductance circuit being electrically connected to an on-package inductor having an inductance value, the at least one inductance circuit allowing the controlled oscillator circuit to be operable in the at least one frequency band.

In another respect, disclosed is a method of assembling a semiconductor package, including: 1) providing a package substrate having a plurality of substrate electrical contacts disposed on a first surface thereof; 2) providing an integrated circuit electrically connected to the first surface of the package substrate, the integrated circuit and the package substrate together forming the semiconductor package, the integrated circuit and package substrate including frequency synthesizer circuitry, the package substrate being provided with at least one substrate electrical contact to provide an electrical connection point during package assembly for at least one or both of a first conductive feature and a second conductive feature of a frequency synthesizer inductance circuit formed entirely within the semiconductor package; and 3) electrically connecting at least one or both of the first and second conductive features to the at least one electrical contact to form the frequency synthesizer inductance circuit, the inductance circuit at least in part determining an output frequency for the frequency synthesizer package.

In yet another respect, disclosed is a method of assembling a semiconductor package, including: providing a package substrate having a plurality of substrate electrical contacts disposed on a first surface thereof; providing an integrated circuit electrically connected to the first surface of the package substrate, the integrated circuit and the package substrate together forming the semiconductor package, the integrated circuit and package substrate including frequency synthesizer circuitry, the package substrate being provided with at least two alternative substrate electrical contacts to provide alternate electrical connection points during package assembly for at least one or both of a first conductive feature and a second conductive feature of a frequency synthesizer inductance circuit formed entirely within the semiconductor package, the inductance value of the frequency synthesizer inductance circuit being dependent on the identity of the alternative substrate electrical contact selected for connection with at least one or both of the first and second conductive features. The method also includes selecting at least one of the alternative substrate electrical contacts; and electrically connecting at least one or both of the first and second conductive features to the selected alternative substrate electrical contact to form the frequency synthesizer inductance circuit, the inductance circuit at least in part determining an output frequency for the frequency synthesizer package.

In a further respect, a semiconductor package includes a package substrate and an integrated circuit. The package substrate has a first surface. The integrated circuit couples electrically to the first surface of the package substrate. The integrated circuit and the package substrate together form the semiconductor package. The semiconductor package also includes a first inductance circuit and a second inductance circuit, both formed within the semiconductor package. The first and second inductance circuits couple to each other in parallel. The first and second inductance circuits have substantially symmetrical geometric characteristics.

DESCRIPTION OF THE DRAWINGS

It is noted that the appended drawings illustrate only exemplary embodiments of the invention and should therefore not be considered to limit its scope because the invention may admit to other equally effective embodiments. In the drawings, the same numeral designators and/or labels used in more than one drawing denote the same, similar, or equivalent functionality, components, and/or blocks.

DETAILED DESCRIPTION OF THE INVENTION

The present invention contemplates a method and apparatus for synthesizing high-frequency signals by implementing a phase-locked loop (PLL) frequency synthesizer with at least one oscillator circuit having on-package band selection inductor/s. As used herein, "on package" means a particular component is mounted or otherwise disposed within or on a semiconductor package that includes an integrated circuit die mounted or otherwise structurally contained within the package. In this regard, an integrated circuit may be electrically connected within the package to a lead frame or other package substrate suitable for electrically connecting the integrated circuit to external package connectors including, but not limited to, pin connectors, lead connectors, solder bumps, etc. "Off package" means that a particular component is not mounted or otherwise disposed within such a semiconductor package, but rather is mounted or disposed separate from the package (e.g., on a printed circuit board). Examples of semiconductor packages include, but are not limited to, package types known in the art such as those illustrated in FIGS. 1A and 1B and described below.

Figure 1A:
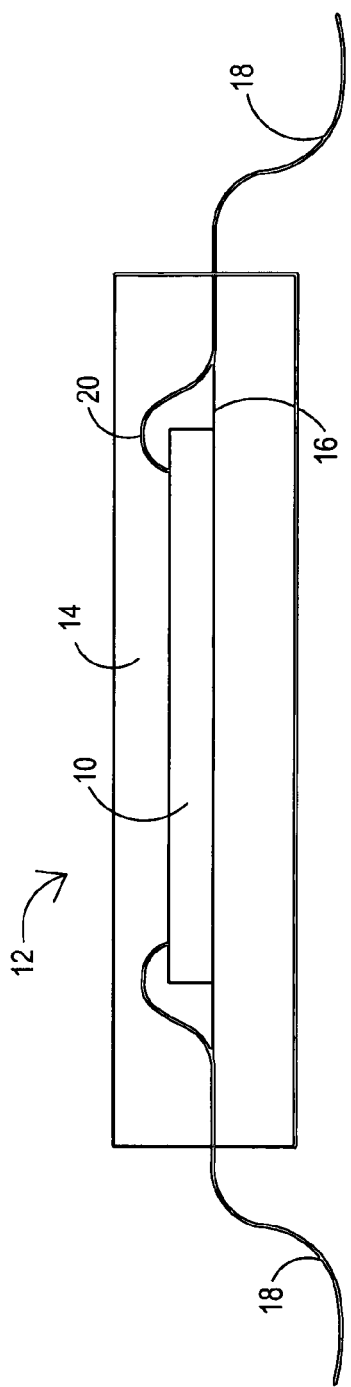
FIG. 1A is a simplified cross sectional view of a semiconductor package including an integrated circuit die contained within the package.

FIG. 1A illustrates an integrated circuit 10 structurally contained within a package 12 that includes an encapsulant molding 14 surrounding integrated circuit 10 and conductive package substrate 16. Package substrate 16 of FIG. 1A may be, for example, a leadframe structure. Wirebonds 20 are shown electrically connecting integrated circuit 10 to conductive package substrate 16. External "gullwing" package leads 18 are shown electrically connected to conductive package substrate 16 and extending from the periphery of encapsulant molding 14 for electrical connection to off-package components contained, for example, on a printed circuit board (not shown).

Figure 1B:
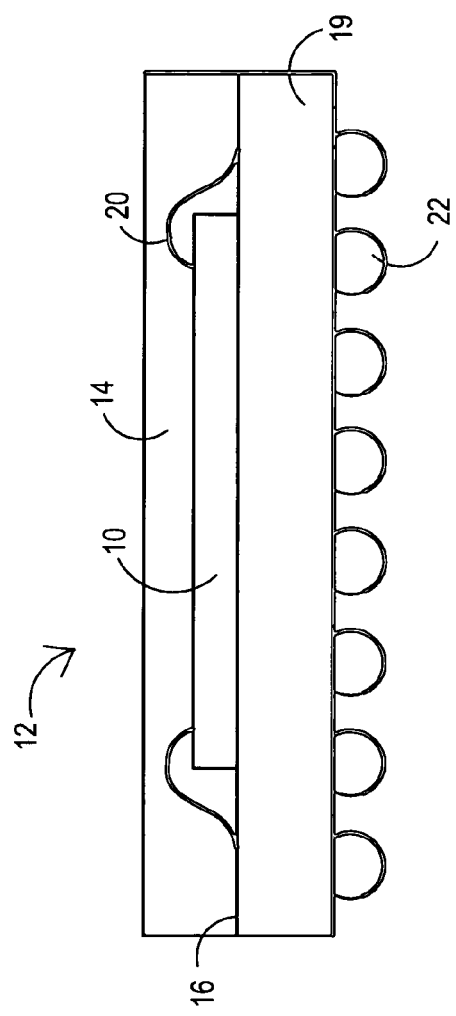
FIG. 1B is a simplified cross sectional view of a semiconductor package including an integrated circuit die contained within the package.

FIG. 1B illustrates an integrated circuit 10 and conductive package substrate 16 structurally contained within a package 12 that includes an upper package molding 14 (e.g., encapsulant molding) and package carrier 19 (e.g., ceramic chip carrier). Wirebonds 20 are shown electrically connecting integrated circuit 10 to conductive package substrate 16. External package solder bumps 22 electrically connected to conductive package substrate 16 are shown extending from the periphery of package carrier 19 for electrical connection to off-package components contained, for example, on a printed circuit board (not shown). It will be understood with benefit of this disclosure that the package types illustrated in FIGS. 1A and 1B are exemplary only, and that benefits of the disclosed method and apparatus may be realized with other package types known in the art, for example, package types utilizing flip chip technology.

Figure 1C:
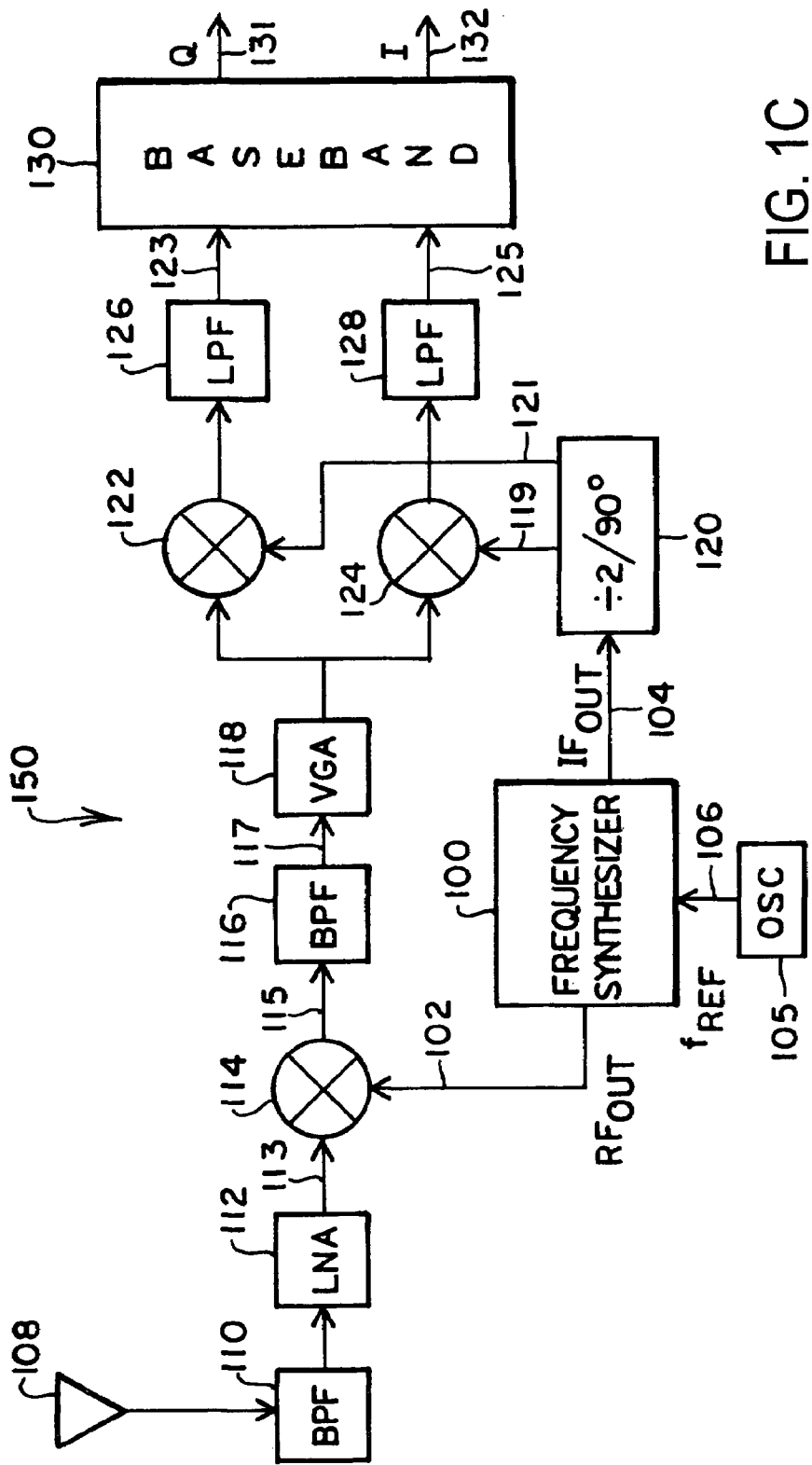
FIG. 1C is a block diagram of receive path circuitry for a wireless communication device, such as a mobile unit in a cellular phone system.

FIG. 1C is a block diagram of receive path circuitry 150 for a wireless communication device, such as a mobile unit in a cellular phone system. An incoming signal is received by the antenna 108, filtered by a band-pass filter 110, and amplified by a low noise amplifier 112. This received signal is typically a radio-frequency (RF) signal, for example a 900 MHz or 1800 MHz signal. This RF signal is usually mixed down to a desired intermediate frequency (IF) before being mixed down to baseband. Using a reference frequency ($f_{REF}$) 106 from a crystal oscillator 105, frequency synthesizer 100 provides an RF mixing signal ($RF_{OUT}$) 102 to mixer 114. Mixer 114 combines this $RF_{OUT}$ signal 102 with the filtered and amplified input signal ($RF_{IN}$) 113 to produce a signal 115 that has two frequency components represented by $|RF_{IN}+RF_{OUT}|$ and $|RF_{IN}-RF_{OUT}|$. The signal at the latter of these two is selected by band-pass filter 116 to provide an IF signal 117. This IF signal 117 is then amplified by variable gain amplifier 118 before being mixed down to baseband by mixers 122 and 124.

Signal processing in mobile phones is typically conducted at baseband using in-phase (I) and quadrature (Q) signals. The Q signal is offset from the I signal by a phase shift of 90 degrees. To provide these two signals, an IF mixing signal ($IF_{OUT}$) 104 and a dual divide-by-two and quadrature shift block (÷2/90°) 120 may be utilized. Frequency synthesizer 100 generates an $IF_{OUT}$ signal 104, for example at about 500 MHz, that is divided by 2 in block 120 to provide $IF_{OUT}/2$ mixing signals 119 and 121. Block 120 delays the signal 121 to mixer 122 by 90 degrees with respect to the signal 119 to mixer 124. Block 120 may be implemented with two flip-flop circuits operating off of opposite edges of the $IF_{OUT}$ signal 104, such that the output of the flip-flops are half the frequency of the $IF_{OUT}$ signal 104, and are 90 degrees offset from each other. The resulting output signals 123 and 125 have two frequency components represented by $|IF+IF_{OUT}/2|$ and $|IF-IF_{OUT}/2|$. The latter frequency component is the desired one and is typically selected such that the baseband signal is centered at DC(f=0 Hz). Assuming the baseband frequency is centered at DC, the $|IF-IF_{OUT}/2|$ signal is selected using low-pass filters 126 and 128. The resulting baseband signal 123 is the Q signal, and the resulting baseband signal 125 is the I signal. These signals 123 and 125 may be further processed at baseband by processing block 130 and provided to the rest of the mobile phone circuitry as Q and I signals 131 and 132.

Note that FIG. 1C illustrates one possible architecture for a receive path circuitry. U.S. patent application Ser. No. 09/821,342, titled "Partitioned Radio-Frequency Apparatus and Associated Methods," filed on Mar. 29, 2001, and incorporated by reference here, includes examples of low-IF receive path circuitries in which one may advantageously employ the inventive concepts. In addition, one may use a variety of receive path circuitry, such as zero-IF or direct conversion receive path circuitry, receive path circuitry with higher IF frequencies, as desired, as persons skilled in the art who have the benefit of the description of the invention understand.

The transmit path circuitry for a wireless communication device, such as a mobile unit in a cellular phone system, may include circuitry to move the outgoing signal from baseband to an RF transmission frequency. A transmit frequency band for cellular phone systems typically includes the identical number of channels as included within the receive frequency band. The transmit channels, however, are shifted from the receive channels by a fixed frequency amount. In such a system, a cellular phone application may utilize the RF mixing signal ($RF_{OUT}$) 102 synthesized by the frequency synthesizer 100 for a given channel in both the receive path and the transmit path circuitry. For example, if the frequency synthesizer 100 has been designed as part of the receive path circuitry 150, the RF mixing signal ($RF_{OUT}$) 102 for a given channel within the receive frequency band may be shifted by the fixed frequency amount to provide a desired RF mixing signal to the transmit path circuitry. Alternatively, the frequency synthesizer 100 may be designed as part of the transmit path circuitry, or two separate frequency synthesizers 100 may be utilized.

Figure 1D:
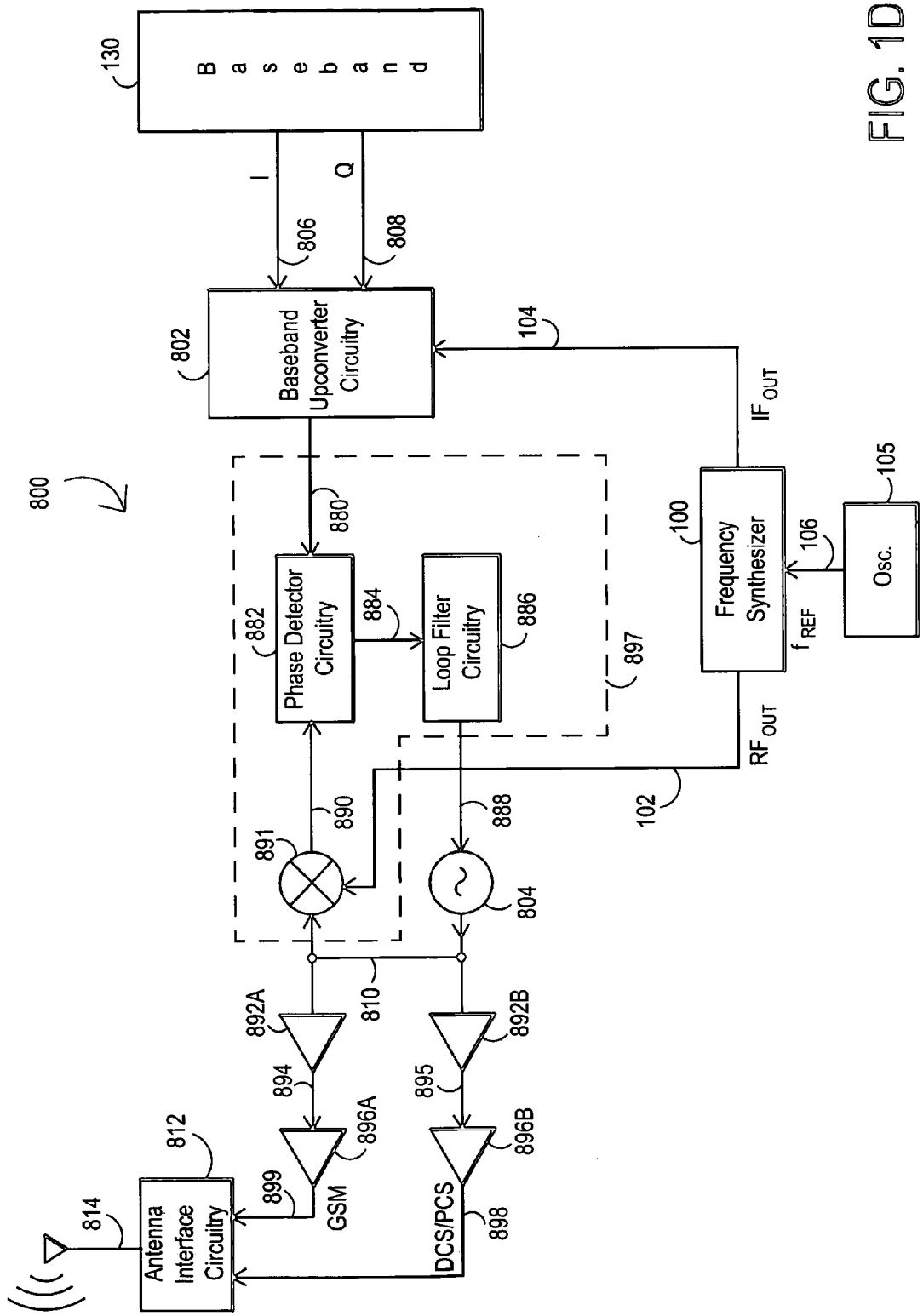
FIG. 1D shows a block diagram of a transmit path circuitry for a wireless communication device, such as a mobile unit in a cellular telephone system.

FIG. 1D shows an embodiment 800 of a multi-band transmit path circuitry. In one variation, the transmit path circuitry in FIG. 1D operates within the GSM (880–915 MHz for transmission), PCS (1850–1910 MHz for transmission), and DCS (1710–1785 MHz for transmission) bands. One, however, may use other variations that have different bands of operation and transmission frequencies.

The embodiment 800 includes frequency synthesizer 100, which receives reference signal ($f_{REF}$) from crystal oscillator 105 (or another suitable oscillator). Frequency synthesizer 100 uses a first PLL (not shown explicitly) to generate RF mixing signal ($RF_{OUT}$) 102. Frequency synthesizer 100 also uses a second PLL (not shown explicitly) to produce IF mixing signal ($IF_{OUT}$) 104.

Table 1 below lists the frequencies for the $RF_{OUT}$ signal 102:

TABLE 1

| Band | $RF_{OUT}$ Frequency (MHz) |
|---|---|
| GSM | 1279–1314 |
| DCS | 1327–1402 |

TABLE 1-continued

| Band | RF$_{OUT}$ Frequency (MHz) |
|---|---|
| PCS | 1423–1483 |
| All Bands | 1279–1483 |

The IF$_{OUT}$ signal 104 may have a frequency between 383 MHz and 427 MHz. Note, however, that one may use other frequencies for the RF$_{OUT}$ signal 102 and the IF$_{OUT}$ signal 104, as desired. The transmit path circuitry uses high-side injection for the GSM band and low-side injection for the DCS and PCS bands, although one may use other transmission schemes, as persons skilled in the art who have the benefit of this description of the invention understand.

The transmit path circuitry includes baseband up-converter circuitry 802, offset PLL circuitry 897, transmit VCO circuitry 804, a pair of transmitter output buffers 892A and 892B, and RF power amplifiers 896A and 896B. The offset PLL circuitry 897 includes offset mixer circuitry 891, phase detector circuitry 882, and loop filter circuitry 886.

The baseband up-converter circuitry 802 accepts the analog in-phase transmit input signal 806 and the analog quadrature transmit input signal 808 from baseband 130 (or another signal source, as desired). The baseband up-converter circuitry 802 mixes those signals with the IF$_{OUT}$ signal 104, and provides a transmit IF signal 880 to the offset PLL circuitry 897. The offset PLL circuitry 897 uses the transmit IF signal 880 as a reference signal. The transmit IF signal 880 preferably comprises a modulated single-sideband IF signal but, as persons skilled in the art would understand, one may use other types of signals and modulation schemes, as desired.

The offset PLL circuitry 897 and the transmit VCO circuitry 810 operate in a feedback loop. The offset mixer circuitry 891 in the offset PLL circuitry 897 mixes the transmit VCO output signal 810 with the RF$_{OUT}$ signal 102, and provides a mixed signal 890 to the phase detector circuitry 882. The phase detector circuitry 882 compares the mixed signal 890 to the transmit IF signal 880 and provides an offset PLL error signal 884 to the loop filter circuitry 886. The loop filter circuitry 886 in turn provides a filtered offset PLL signal 888 to the transmit VCO circuitry 804. The output frequency of the transmit VCO circuitry 804 centers between the DCS and PCS bands, and its output is divided by two for the GSM band, although one may use other bands and frequency plans, as desired.

Transmitter output buffers 892A and 892B receive the transmit VCO output signal 810 and provide buffered transmit signals 894 and 895 to a pair of RF power amplifiers 896A and 896B. The power amplifiers 896A and 896B provide amplified RF signals 899 and 898, respectively, for transmission through antenna interface circuitry 812 (e.g., a switch, diplexer, etc.) and antenna 814. Power amplifier 896A provides the RF signal 899 for the GSM band, whereas power amplifier 896B supplies the RF signal 898 for the DCS and PCS bands. Persons skilled in the art who have the benefit of the description of the invention, however, understand that one may use other arrangements of power amplifiers and frequency bands. Moreover, one may use RF filter circuitry within the output path of the transmitter circuitry 877, as desired.

To reduce interference, the embodiment 800 may use differential signals, as desired. For example, RF$_{OUT}$ signal 102, IF$_{OUT}$ signal 104, analog in-phase transmit input signal 806, and analog quadrature transmit input signal 808 may constitute differential signals.

The PLL or PLLs in frequency synthesizer 100 and the transmit VCO circuitry 810 typically use one or more inductors in an LC tank (as described below in more detail). One may advantageously use wire bond inductors according the invention to implement the LC tanks.

The transmit path circuitry shown in FIG. 1D constitutes one possible architecture for a transmit path circuitry that may advantageously use the inventive concepts. As persons of ordinary skill in the art who have the benefit of the description of the invention understand, one may use other transmit path circuitry architectures and circuit arrangements, as desired, for example, direct up-conversion transmit path circuitries, and the like. U.S. patent application Ser. No. 10/075,094, titled "Radio-Frequency Communication Apparatus and Associated Methods"; U.S. patent application Ser. No. 10/075,098, titled "Apparatus and Methods for Generating Radio Frequencies in Communication Circuitry"; and U.S. patent application Ser. No. 10/074,591, titled "Apparatus for Generating Multiple Radio Frequencies in Communication Circuitry and Associated Methods," incorporated by reference here, describe further details of the transmit path circuitry and its various components in exemplary RF circuitry that can use the invention.

Furthermore, one may combine a receive path circuitry and a transmit path circuitry to realize an RF transceiver. U.S. patent application Ser. No. 09/821,342, referenced above and incorporated by reference, includes examples of RF transceivers in which one may advantageously employ the inventive concepts.

Figure 2:
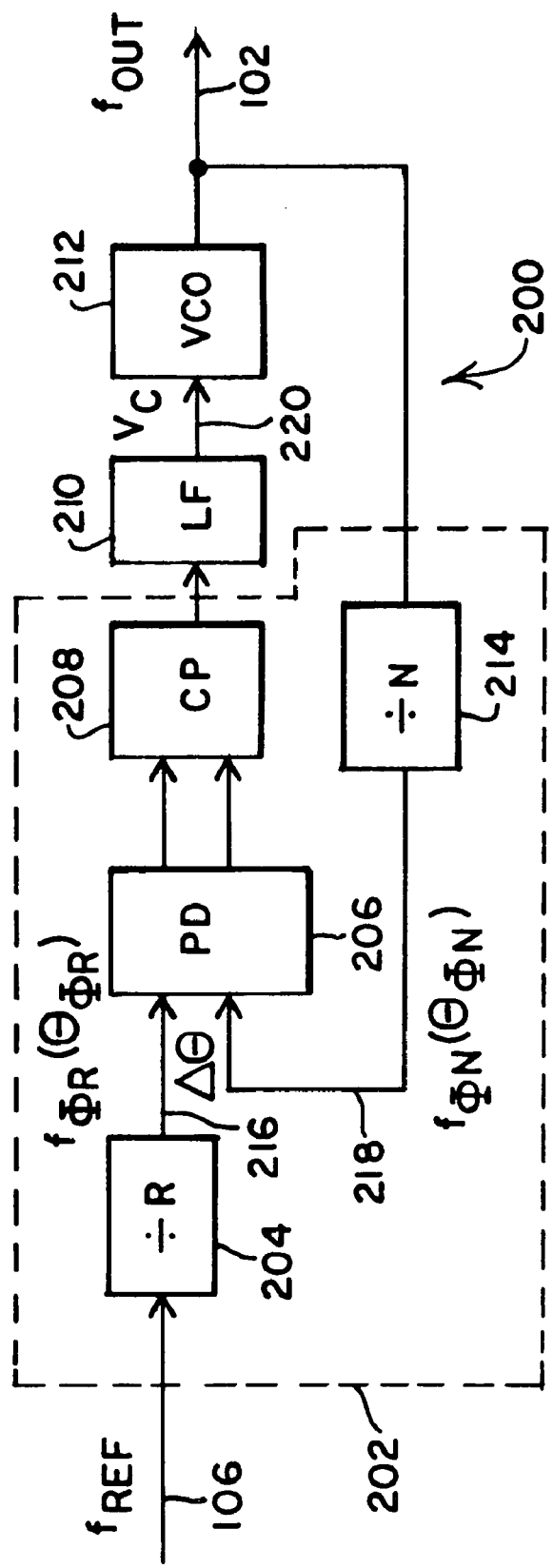
FIG. 2 is a block diagram of phase-locked loop (PLL) circuitry for synthesizing frequencies required by the frequency synthesizer in FIG. 1C.

FIG. 2 is a block diagram of phase-locked loop (PLL) circuitry 200 for synthesizing one of the frequencies required by frequency synthesizer 100. A second PLL 200 may be implemented to provide the second frequency. The reference frequency (f$_{REF}$) 106 is received by a divide-by-R (÷R) counter 204, and the output frequency (f$_{OUT}$) 102 is received by a divide-by-N (÷N) counter 214. The resulting divided signals (f$_{\phi R}$) 216 and (f$_{\phi N}$) 218 are received by a phase detector (PD) 206. The PD 206 determines the phase difference (Δθ) between the phase (θ$_{100\ R}$) of the divided signal 216 and the phase (θ$_{\phi N}$) of the divided signal 218. The PD 206 uses this phase difference (Δθ) to drive a charge pump (CP) 208. The CP 208 provides a voltage output that is filtered by a loop filter 210 to provide a voltage control (V$_C$) signal 220. The V$_C$ signal 220 controls the output frequency (f$_{OUT}$) 102 of a voltage controlled oscillator (VCO) 212. The values for N and R may be selected to provide a desired output frequency such that f$_{OUT}$=N (f$_{REF}$/R). For a typical mobile phone application, the IF$_{OUT}$ frequency 104 will remain constant, while the RF$_{OUT}$ frequency 102 will change depending upon the channel of the incoming signal. Thus, a first PLL may be used to provide the IF$_{OUT}$ frequency 104, and its N and R values may be programmed once and then left alone. A second PLL may be used to provide the RF$_{OUT}$ frequency 102, and its N and R values may be selectively programmed to provide the desired RF$_{OUT}$ signal 102. If desired, the R value for this second PLL may be programmed once and left alone, while the N value may be used to select the desired RF$_{OUT}$ signal 102.

In many cases, it is desirable for the PLL circuitry 200 to be integrated onto a single chip. For example, a frequency synthesis design that is capable of full integration while still providing high fidelity high-frequency signals may be provided as described in U.S. patent application Ser. No.

Figure 3:
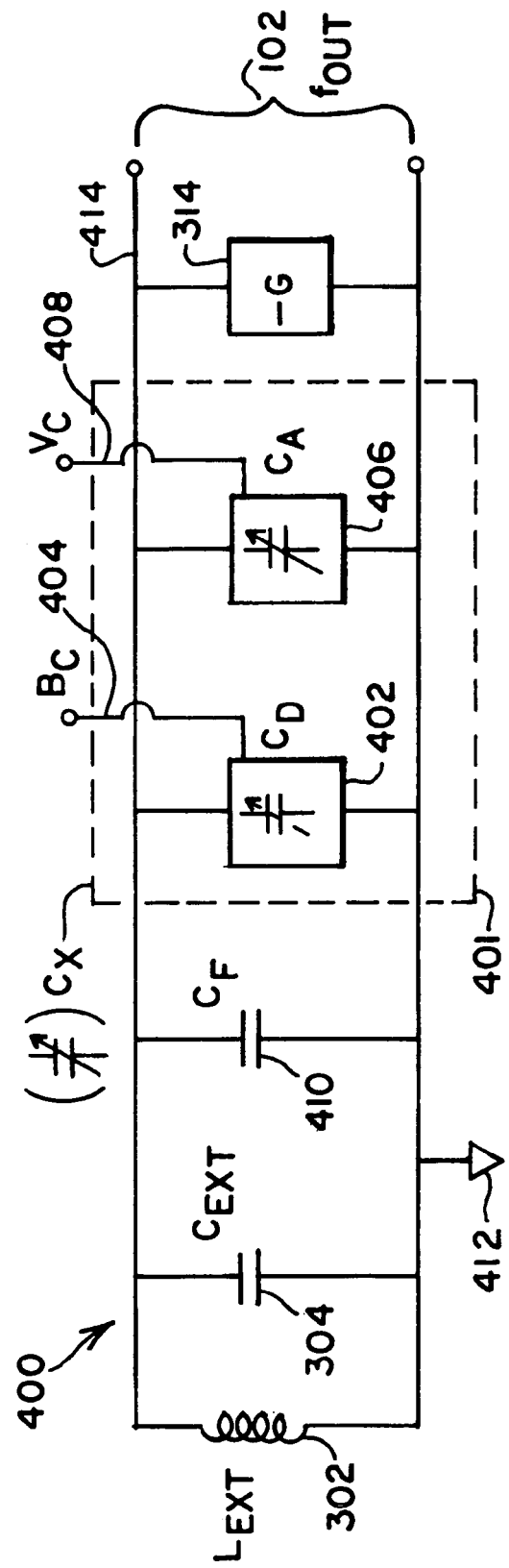
FIG. 3 depicts a general circuit diagram of a digital and analog VCO implementation according to one embodiment of the present invention.

09/087,649 filed May 29, 1998, and incorporated herein by reference. FIG. 3 depicts a general circuit diagram of a VCO 400 according to such a design. The VCO 400 produces an output frequency ($f_{OUT}$) 102 using an LC tank oscillator having an external inductor ($L_{EXT}$) 302, that may be replaced with the on-package inductors of the disclosed method and apparatus. The external capacitor ($C_{EXT}$) 304 represents any desired externally connected capacitance and the parasitic capacitance of the semiconductor device leads. A variable capacitance ($C_X$) 401 is achieved with a discretely variable capacitance ($C_D$) 402 in conjunction with a continuously variable capacitance ($C_A$) 406. The discretely variable capacitance ($C_D$) 402 may be controlled by a digital control word ($B_C$) 404, and the continuously variable capacitance ($C_A$) 406 may be controlled by a voltage control signal ($V_C$) 408. It is noted that the digital control word ($B_C$) 404 and the voltage control signal ($V_C$) 408 may be a single signal or a plurality of signals, as desired, depending upon the implementation for the discretely variable capacitance ($C_D$) 402 and the continuously variable capacitance ($C_A$) 406. A fixed capacitance ($C_F$) 410 represents internal parasitic capacitance along with any desired fixed capacitance connected internally to the integrated circuit. A negative conductance source (−G) 314 is also provided to compensate for the losses in the VCO 400.

In operation, the discretely variable capacitance ($C_D$) 402 of FIG. 3 may be used after manufacture to dynamically compensate for any component tolerance problems including all of the internal capacitance values, any external capacitor ($C_{EXT}$) 304, and the on-package inductor corresponding to ($L_{EXT}$) 302. In addition, the discretely variable capacitance ($C_D$) 402 may be used to provide coarse tuning of the desired output frequency, thereby reducing the frequency range that must be covered by variations in the capacitance of the continuously variable capacitance ($C_A$) 406. After coarse tuning by the discretely variable capacitance ($C_D$) 402, the continuously variable capacitance ($C_A$) 406 may be used to provide fine tuning of the desired output frequency. This coarse and fine tuning initially calibrates the output frequency ($f_{OUT}$) 102 to the desired output frequency. After the initial calibration, the continuously variable capacitance ($C_A$) 406 may be used to compensate for any post-calibration frequency drift. Such post-calibration frequency drift will typically occur due to a variety of factors, including for example temperature variations. In this way, a high-frequency PLL frequency synthesizer may be provided that produces an output frequency having phase noise of less than about −110 dBc/$\sqrt{Hz}$ at 100 kHz from the output frequency.

An example will now be provided for the coarse and fine tuning that may be provided by a VCO 400 of FIG. 3. As described above, the United States IS-54 standard utilizes on the order of eight hundred 30 kHz wide channels in a frequency band of 869–894 MHz for transmitting information from a base station to a mobile unit. One receive channel may be for example at 870.03 MHz. Assuming that a cellular phone application has been designed to have an IF frequency of 250 MHz, the RF mixing frequency that must be synthesized by the frequency synthesizer for this channel would need to be 1120.03 MHz. (It is noted that for the 900 MHz frequency band, the RF mixing frequency utilized is typically above the channel frequency, although an RF mixing frequency below the channel frequency may also be used.) The discretely variable capacitance ($C_D$) 402 may be designed to coarsely tune the RF output frequency of the frequency synthesizer to about 0.1% of the desired frequency of 1120.03 MHz or to within about 1 MHz. The continuously variable capacitance ($C_A$) 406 may be designed to provide a frequency range of about 1% of the desired frequency of 1120.03 MHz or a range of about 11 MHz, which is about 10 times the coarse tuning accuracy of the discretely variable capacitance ($C_D$) 402. This frequency range allows the continuously variable capacitance ($C_A$) 406 to finely tune the RF output frequency of the frequency synthesizer to the desired frequency of 1120.03 MHz and to compensate for post-calibration frequency drift. The initial voltage input values for the continuously variable capacitance ($C_A$) 406 may be selected so that the continuously variable capacitance ($C_A$) 406 may move the RF output frequency either up or down by roughly the same amount.

Figure 4:
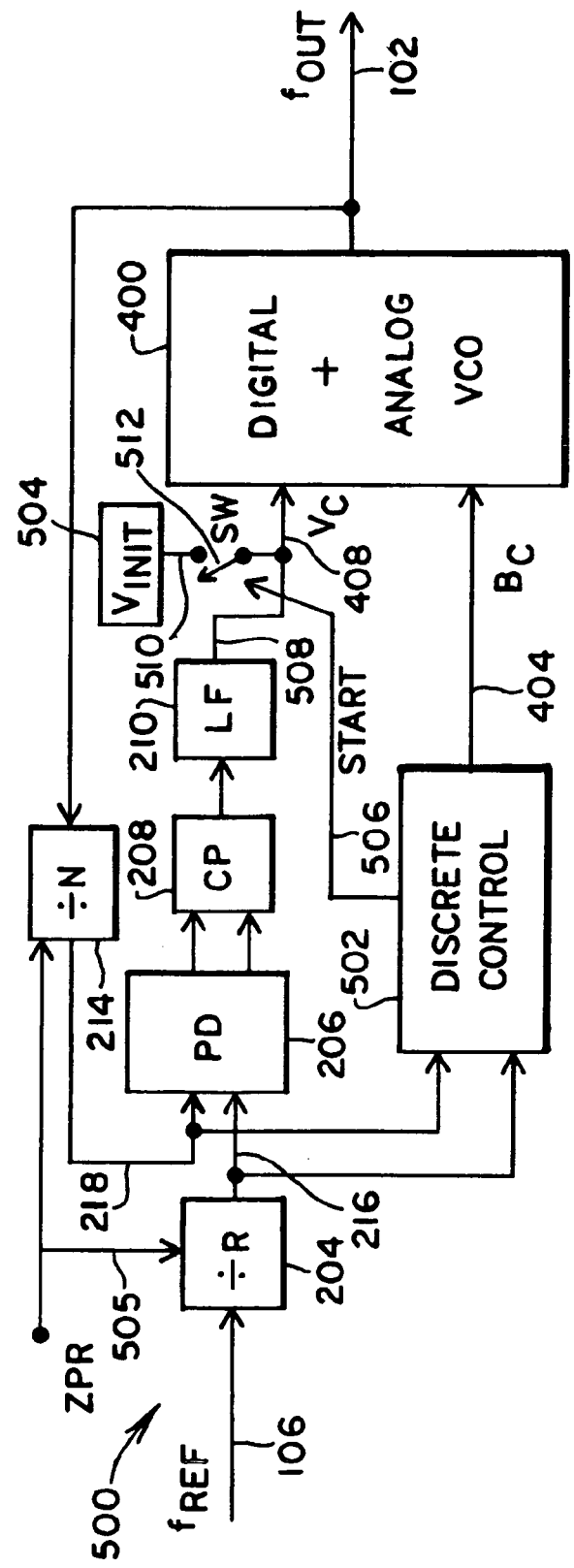
FIG. 4 is a block diagram of a frequency synthesizer that takes advantage of a digital and analog VCO implementation according to one embodiment of the present invention.

FIG. 4 is a block diagram of a frequency synthesizer 500 that takes advantage of a digital and analog VCO, such as VCO 400 of FIG. 3. The input reference frequency ($f_{REF}$) 106 is received by the divide-by-R (÷R) counter 204. The output frequency ($f_{OUT}$) 102 is received by the divide-by-N (÷N) counter 214. The discrete control block 502 receives the divided output frequency ($f_{OUT}/N$) 218 and the divided reference frequency ($f_{REF}/R$) 216, and the discrete control block 502 outputs a digital control word ($B_C$) to the digital and analog VCO 400. The phase detector (PD) 206 compares the phase difference between the divided output frequency ($f_{OUT}/N$) 218 and the divided reference frequency ($f_{REF}/R$) 216 and provides signals to the charge pump (CP) 208 that depends upon this phase difference. The output of the charge pump (CP) 208 is filtered by the loop filter (LF) 210 to provide a first control voltage node 508. Initial voltage generator block ($V_{INIT}$) 504 provides a second control voltage node 510. A switch (SW) 512 allows for selection of control voltage node 510 as the voltage node to be provided to the voltage control ($V_C$) input 408 to the digital and analog controlled VCO 400.

When PLL 500 initiates, control of the output frequency ($F_{OUT}$) 102 lies with discrete control block 502. The switch 512 selects the initial voltage node 510 as the voltage control for the voltage control ($V_C$) input 408. The voltage control ($V_C$) is used as the control voltage for the continuously variable capacitance ($C_A$) 406 within the digital and analog controlled VCO 400. In addition to providing a voltage input to the voltage control ($V_C$) input 408, this connection also charges the capacitors within the loop filter (LF) 210 to an initial voltage value. The discrete control block 502 includes digital logic that will determine through a desired procedure how to adjust the discretely variable capacitance ($C_D$) 402 to coarsely tune the output frequency ($f_{OUT}$) 102. This determination may depend for example upon a comparison of the reference frequency ($f_{REF}$) 106 to the output frequency ($f_{OUT}$) 102 or a comparison of the divided reference frequency ($f_{REF}/R$) 216 to the divided output frequency ($f_{OUT}/N$) 218. Depending upon the determination made, the discrete control block 502 may adjust the digital control word ($B_C$) 404. The digital control word ($B_C$) 404 is used to provide control signals to the discretely variable capacitance ($C_D$) 402 within the digital and analog controlled VCO 400.

Once the discrete control block 502 completes its coarse tuning procedure, the discrete control block 502 may fix the digital control word ($B_C$) 404 and then assert the START signal 506 to change switch (SW) 512 so that it deselects the control node 510. At this point, the control voltage node 508 supplies the voltage to the control voltage ($V_C$) node 408. The divide-by-R (÷R) and divide-by-N (÷N) counters 204 and 214 are reset with the zero-phase restart (ZPR) signal 505. The zero-phase restart (ZPR) signal 505 presets the counters within the divide-by-R (÷R) and divide-by-N (÷N) counters 204 and 214 so that the initial phase error is as small as possible when the first analog loop becomes operable. From this point, the output frequency ($f_{OUT}$) 102 is fine tuned by the continuously variable capacitance ($C_A$) 406 through operation of phase detector (PD) 206, the charge pump (CP) 208 and the loop filter (LF) 210. If desired, the discrete control 502 may continue to monitor the output frequency ($f_{OUT}$) 102. If too great of an error is detected, discrete control 502 may move the switch (SW) 512 back to select initial control node 510 and again modify the digital control word ($B_C$) 404 based upon a desired procedure.

In the circuit of FIG. 4, therefore, only one control loop, either digital or analog, is tuning the output frequency ($f_{OUT}$) 102 at any given moment. Initially, when the output frequency ($f_{OUT}$) 102 is likely far from the desired frequency, the digital control loop is operable and the output frequency ($f_{OUT}$) 102 is modified by the digital control word ($B_C$) 404 provided by the discrete control block 502. When the discrete control block 502 completes its coarse tuning procedure, the discrete control block 502 may assert the START signal 506, thereby starting the action of the analog loop by setting the switch (SW) 512 to deselect the initial voltage generator block ($V_{INIT}$) 504 and pass control to the voltage control node 508. At this point, the analog loop begins fine tuning the output frequency ($f_{OUT}$) 102 until a stable output frequency is reached. To allow the continuously variable capacitance ($C_A$) 406 within the analog loop to move the output frequency ($f_{OUT}$) 102 either faster or slower in roughly equal amounts, the voltage value provided by the initial voltage generator block ($V_{INIT}$) 504 may be selected to be within the middle of the voltage range that may be provided by the control voltage node 508 from the loop filter (LF) 210. It is also noted that if desired, a frequency synthesizer embodiment of FIG. 4 may be implemented in which both the digital and analog control loops are active at the same time.

The techniques discussed above have been shown with reference to a frequency synthesizer in which the fine tuning analog control is accomplished with standard PLL components. For example with reference to FIG. 4, a phase detector 206, a charge pump 208, and a loop filter 210 may be used to provide the voltage control for a voltage controlled oscillator. However, in order to more easily integrate the PLL within a single integrated circuit, alternative PLL designs may be utilized.

The use of multiple analog inputs to perform the fine control of the VCO may be seen with reference to FIG. 4. As discussed above with reference to FIG. 4, the fine analog control of the VCO 400 may be achieved through the use of the continuously variable capacitance ($C_A$) 406. As shown in FIG. 4, the continuously variable capacitance ($C_A$) 406 is controlled by the voltage control signal ($V_C$) 408.

Figure 5A:
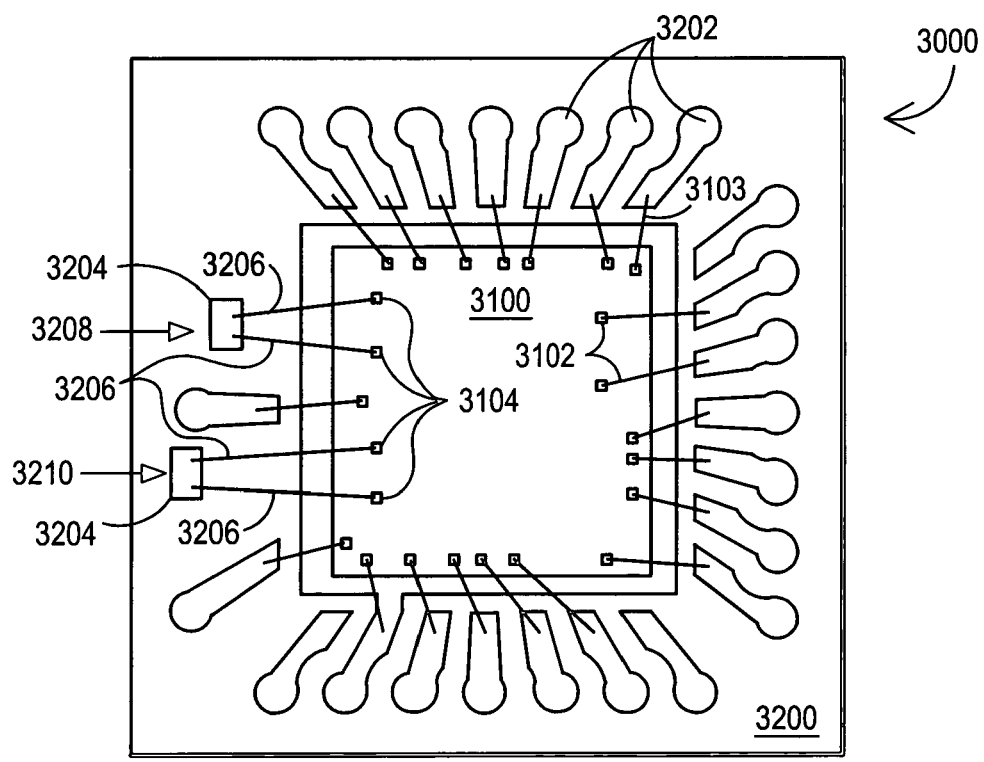
FIG. 5A is a simplified overhead view of a frequency synthesizer package having package substrate inductor circuit bonding pads and two induction loop circuits according to one embodiment of the present invention.

FIG. 5A shows one embodiment of a portion of a frequency synthesizer package 3000 that includes an integrated circuit 3100 mounted on or otherwise electrically connected to a package substrate 3200. The exemplary package substrate 3200 shown in FIG. 5A is a ceramic package substrate having an upper layer of metalization for electrical connections, such as illustrated substrate bonding pads 3202 and 3204. Examples of suitable ceramic package substrates include, but are not limited to, ceramic package substrates available from Kyocera, NTK, CTS, etc. However, other types of package substrates and/or connection methods may be used within a package. In this regard, a package substrate may be electrically connected to an integrated circuit using any attachment method/s known in the art suitable for forming semiconductor packages with integrated circuit dies (e.g., wire bonds, solder bumps, etc.). Examples of suitable package types include, but are not limited to, lead frame packages, ball grid array (BGA) packages (including BGA packages fabricated using tape automated bonding (TAB process and flexible circuitry)); pin grid array packages (PGA); thin small outline packages (TSOP); small outline J-lead packages (SOJ); small outline packages (SOP); chip scale packages (CSP), etc.

In FIG. 5A, a plurality of package substrate I/O electrical bonding pads 3202 are provided on package substrate 3200 for input/output electrical connection with one or more circuits contained within integrated circuit 3100. Within package substrate 3200, provision is made for electrical connection of substrate I/O bonding pads 3202 to off-package circuitry (not shown), such as a printed circuit board. Examples of such provisions for connection include, but are not limited to, external package leads disposed on the periphery of substrate 3200, electrically conductive vias (not shown) connected to package I/O bonding pads 3202 and extending through to substrate solder bump connections provided on the opposite side of package 3000, etc. In the exemplary embodiment shown, wire bonds 3103 are shown for electrically connecting substrate I/O bonding pads 3202 to integrated circuit bonding pads 3102.

Also shown in FIG. 5A are package substrate inductor circuit bonding pads 3204, to which connection to VCO circuitry contained within or on integrated circuit 3100 is made by loop inductor circuit wire bonds 3206. In the exemplary embodiment shown, two on-package induction loop circuits 3208 and 3210 are shown, each formed by connection of two inductor circuit wire bonds 3206 from integrated circuit 3100 to a respective single substrate inductor circuit bonding pad 3204. In this regard, each inductor circuit wire bond 3206 extends from a substrate inductor circuit bonding pad 3204 to a respective integrated circuit inductor circuit bonding pad 3104, and has a length defined by the distance between the connected substrate inductor circuit bonding pad 3204 and integrated circuit inductor circuit bonding pad 3104. Although metalized ceramic substrate 3200 is illustrated in FIG. 5A, it will be understood that induction loop bonds may be formed in a similar manner using other types of package substrates, for example, by connection of two inductor circuit wire bonds 3206 to a single common bond finger of a lead frame package substrate. Such a bond finger may extend as a no connect ("NC") pin outside of the package encapsulant, and may be left floating on the PC board, however because the inductor loop is closed within the package the inductor is still formed on-package.

In one exemplary embodiment, induction loop circuits 3208 and 3210 may be employed as on-package inductors, for example replacing ($L_{EXT}$) 302 in VCO 400 of FIG. 3. In this capacity, one or more LC tank oscillator circuits may be used in a frequency synthesizer used to produce an output frequency ($f_{OUT}$) for mixing with one or more RF signals (e.g., 900 MHz or 1800 MHz signals), as described in relation to the circuitry of FIGS. 1–4. For example, in one exemplary embodiment induction loop circuits 3208 and 3210 may be provided for band selection purposes, with one loop corresponding to an LC tank oscillator circuit used in a frequency synthesizer used to produce an output frequency ($f_{OUT}$) for mixing with an RF signal of 900 MHz and the other loop corresponding to an LC tank oscillator circuit used in a frequency synthesizer used to produce an output frequency ($f_{OUT}$) for mixing with an RF signal of 1800 MHz. These signal frequencies are exemplary only, and it will be understood by those of skill in the art with benefit of this disclosure that the method and apparatus disclosed herein may be employed in the production of signals having virtually any frequency desired, and/or for mixing with either RF or IF signals.

For example, in another embodiment, one or more induction loop circuits may be similarly employed in oscillator circuits used to produce output frequencies for mixing with IF signals, so that either or both types of inductors (i.e., RF-mixing related and IF-mixing related inductors) of a frequency synthesizer may be contained on-package. In this regard, one or more IF-mixing related inductors of a frequency synthesizer may be provided off-package, while one or more RF-mixing related inductors of the frequency synthesizer are provided on-package, and vice-versa. Thus, using the disclosed method and apparatus, it is possible to include as many or as few RF-mixing related and/or IF-mixing related inductors of frequency synthesizer on-package as desired, advantageously allowing for provision of a frequency synthesizer that may be wholly contained in a single package, including all RF-mixing related and IF-mixing related inductors.

On-package induction loop circuits 3208 and 3210 may, for example, have different inductance values and be used to form two selectable on-package inductors for a single LC tank oscillator circuit that may be alternatively selected for inclusion in the LC tank oscillator circuit, for example, by switching circuitry present within integrated circuit 3100. Alternatively, on-package induction loop circuits 3208 and 3210 may be used to form separate on-package inductors for two respective and separate LC tank oscillator circuits having different inductance values. Although FIG. 5A illustrates the formation of two on-package induction loop circuits, it will be understood with the benefit of this disclosure that one induction loop or more than two induction loop circuits may be provided for in a similar manner, by providing an appropriate number of substrate inductor circuit bonding pads 3204 and inductor circuit wire bonds 3206. Once again, each provided induction loop circuit may be connected to a separate respective LC tank oscillator circuit, or may form one of a plurality of switchable inductance circuits connected to a single LC tank oscillator circuit. In either case, induction loop circuits 3208 and 3210 may provide differing inductance values dependent, for example, at least partially on the length of inductor circuit wire bonds 3206 extending from integrated circuit inductor bonding pads 3104 to substrate inductor circuit bonding pads 3204.

Further contemplated in the present disclosure is the provision of multiple alternative package electrical connection points to provide for selection of alternative band-selection inductance values during assembly of PLL oscillator circuits. In one embodiment, the disclosed method and apparatus may be incorporated into a variable capacitance voltage controlled oscillator (VCO) that includes a discretely variable capacitance in conjunction with a continuously variable capacitance. The frequencies synthesized by the present invention may be used in receive and transmit path circuitry for wireless communication devices.

Figure 5B:
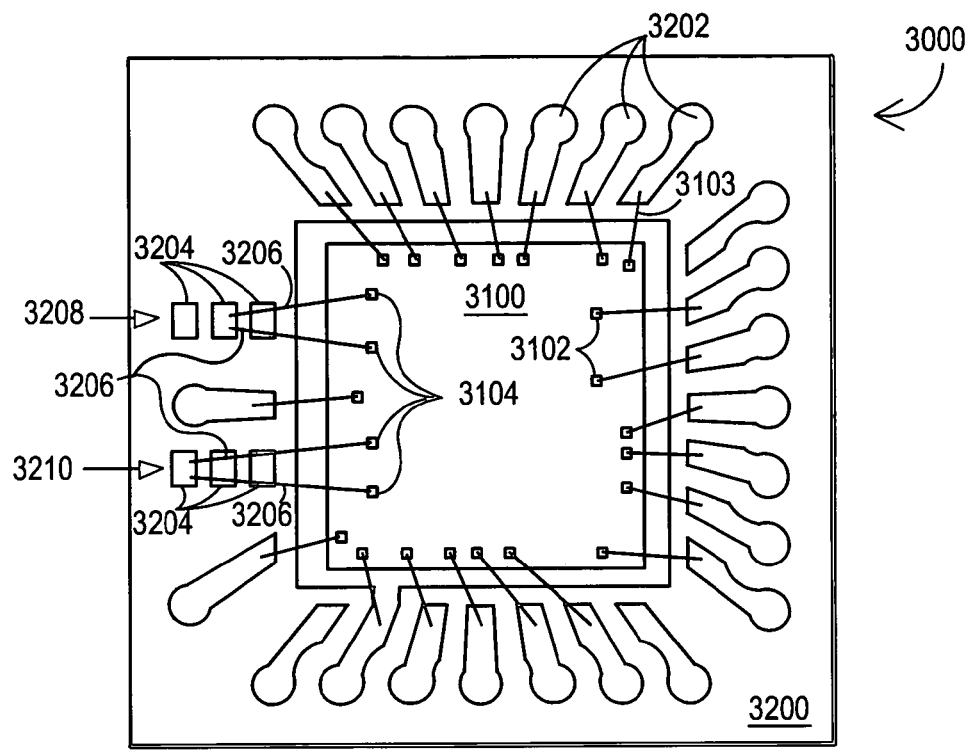
FIG. 5B is a simplified overhead view of a frequency synthesizer package having alternative package substrate inductor circuit bonding pads and two induction loop circuits according to one embodiment of the present invention.

FIG. 5B shows a set of three alternative substrate inductor circuit bonding pads 3204 formed on package substrate 3200 corresponding to each of induction loop circuits 3208 and 3210. The provision of multiple substrate inductor circuit bonding pads 3204 corresponding to a given induction loop circuit allows for selection of one of several alternative or selectable inductance values for inclusion in a given induction loop circuit, for example, during package assembly. Although three alternative substrate inductor circuit bonding pads 3204 are shown provided for each induction loop circuit in FIG. 5B, it will be understood with the benefit of this disclosure that it is also possible that two or four or more alternative inductor circuit bonding pads 3204 may be provided to correspond to each induction loop circuit when it is desirable to provide a selectable inductance option. Furthermore, it will be understood that as few as one induction loop circuit, or more than two induction loop circuits, may be similarly provided on a package substrate 3200 in a manner similar to illustrated induction loop circuits 3208 and 3210.

As previously mentioned, in the embodiments illustrated in FIGS. 5A and 5B, inductance value of each of inductance loop circuits 3208 and 3210 may depend in part on the length of inductor circuit wire bonds 3206. As may be seen in FIGS. 5A and 5B, the inductor circuit wire bonds 3206 utilized in induction loop circuit 3208 are relatively shorter in length than the inductor circuit wire bonds utilized in induction loop circuit 3210. In FIG. 5B, this length difference is accommodated by the provision of alternative substrate inductor circuit bonding pads 3204 spaced at varying distances from the respective integrated circuit inductor circuit bonding pads 3104 corresponding to each respective induction loop circuit. In addition to variation in length of inductor circuit wire bonds 3206, it will be understood with benefit of this disclosure by those of skill in the art that variable or selectable inductance capability may also be provided by provision of differing geometry and/or materials for substrate inductor circuit bonding pads 3204 and/or inductor circuit wire bonds 3206. It will also be understood that differing numbers of inductor circuit bonding pads, and/or differing intervals between substrate inductor circuit bonding pads, may be provided for each respective induction loop circuit.

Figure 6:
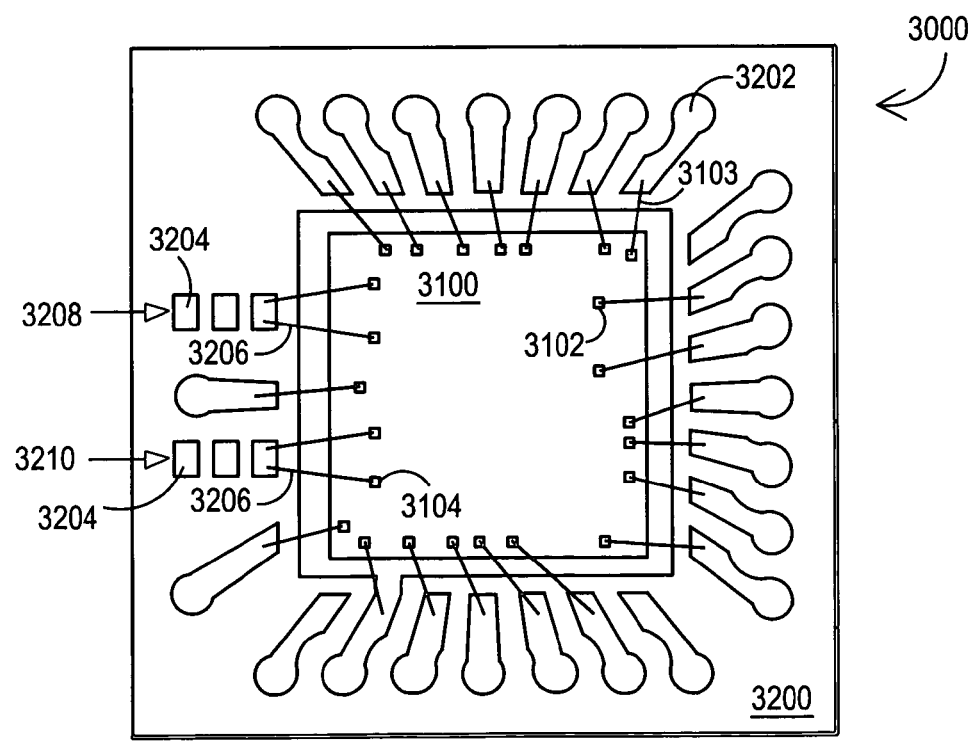
FIG. 6 is a simplified overhead view of a frequency synthesizer package having alternative package substrate inductor circuit bonding pads and two induction loop circuits according to one embodiment of the present invention.

With the provision of multiple alternative inductor circuit substrate bonding pads 3204, selection of a desired inductance value may be made by connecting appropriate substrate inductor circuit bonding pad/s 3204 to a respective integrated circuit inductor circuit bonding pad 3104 corresponding to the induction loop circuit of interest. For example, FIG. 6 illustrates frequency synthesizer package 3000 having a different selected induction loop circuit connection configuration to that shown in FIG. 5B, that is in this case inductor circuit wire bonds 3206 are connected to the most inboard of the substrate inductor circuit bonding pads 3204 for each of induction loop circuits 3208 and 3210.

Advantageously, selection of inductance value/s using alternative substrate inductor circuit bonding pads may be made during package assembly in one of a number of different circumstances. For example, as previously described, a frequency synthesizer package may be provided with a number of alternative substrate inductor circuit bonding pads corresponding to alternative inductance values that are anticipated, but yet to be finalized, for a final product. In this way, prototype frequency synthesizer packages may be manufactured with the inductance value then selected during production after testing of the prototypes, in order to optimize product performance. The values found desirable during prototype testing may then determine which inductor bonding pads 3204 are utilized during high volume manufacturing. Alternatively, testing may be carried out on individual lots of semiconductor wafers, individual semiconductor wafers, or on individual packages. Inductance values may then be changed or varied on a lot-by-lot basis, wafer-by-wafer basis, or package-by-package basis, respectively, based on the testing of each individual grouping. As a further alternative, a single frequency synthesizer package design may include alternative substrate inductor circuit bonding pads to allow for incorporation of the same frequency synthesizer integrated circuit into different product applications requiring differing inductance values. In this way, frequency synthesizer packages intended for a first application may employ inductor circuit wire bonds connected to different substrate inductor circuit bonding pads than those pads connected to in frequency synthesizer packages intended for a second application.

It will be understood with the benefit of this disclosure that multiple alternative substrate inductor circuit bonding pads may be provided for induction loop circuits of virtually any design or circuit configuration. For example, when employed in a VCO circuit application, induction loop circuits 3208 and 3210 of FIG. 5A or 5B may be connected to operate separately with respective separate first and second VCO circuits, connected with integrated switch circuitry to operate in an alternate switchable manner with a single VCO circuit (e.g., to provide two differing inductance values for a single VCO circuit), or may be connected in switchable or permanent manner so that both loop circuits operate together in series or parallel in the same circuit. It will also be understood that the number of induction loop circuits provided for a frequency synthesizer package may be as many as necessary or desired to function in a manner as described for any of the embodiments herein.

Although the illustrated embodiments show a single inductor circuit wire bond extending from each integrated circuit inductor circuit bonding pad 3104 to connect with a respective single substrate inductor circuit bonding pad 3204, it will be understood with benefit of this disclosure that in other embodiments multiple inductor circuit wire bonds 3206 may extend from a single integrated circuit inductor circuit bonding pad 3104 to connect with more than one substrate inductor circuit bonding pads 3204, that multiple inductor circuit wire bonds 3206 may extend from a single substrate inductor circuit bonding pad 3204 to connect with more than one integrated circuit inductor circuit bonding pads 3104, or that a combination of both such configurations may be present. It will also be understood that any combination or number of available substrate inductor circuit bonding pads 3204 may be so connected for inclusion in one or more induction loop circuits as so desired.

Figure 7A:
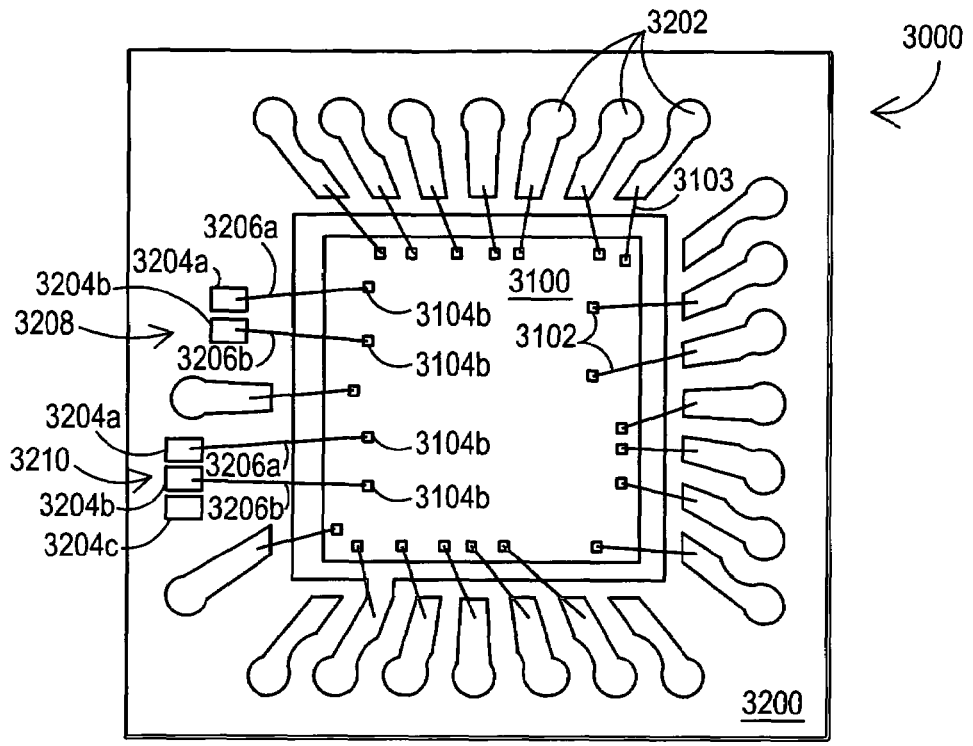
FIG. 7A is a simplified overhead view of a frequency synthesizer package having package substrate inductor circuit bonding pads and two induction loop circuits according to one embodiment of the present invention.

Although one embodiment of the disclosed method and apparatus has been illustrated in FIGS. 5A, 5B, and 6 in which selectable inductance values are provided by the provision of multiple alternative substrate inductor circuit bonding pads, it will be understood with the benefit of this disclosure that inductance values may be provided on-package in a frequency synthesizer package using substrate electrical contacts of any configuration suitable for providing inductance values. For example, in the embodiment illustrated in FIG. 7A, a first individual substrate inductor circuit bonding pad 3204a may be provided for connection to a first integrated circuit inductor bonding pad 3104a with inductor circuit wire bond 3206a, and a second individual substrate inductor circuit bonding pad 3204b may be provided for connection to a second integrated circuit inductor bonding pad 3104b with a second inductor circuit wire bond 3206b, and each of the two individual inductor circuit bonding pads 3204a and 3204b connected on or within package substrate 3200 to complete the induction loop circuit with a material of desired inductance value (e.g., having appropriate geometry, length and/or material). Also as shown in FIG. 7A, one or more additional individual substrate inductor circuit bonding pads 3204c may be provided as an alternate connection point to, for example, second integrated. circuit inductor bonding pad 3104a via second inductor wire bond 3206b. As with other embodiments disclosed herein, as few as one induction loop circuit, and as many as three or more induction loop circuits may be similarly provided for in a given package.

Figure 7B:
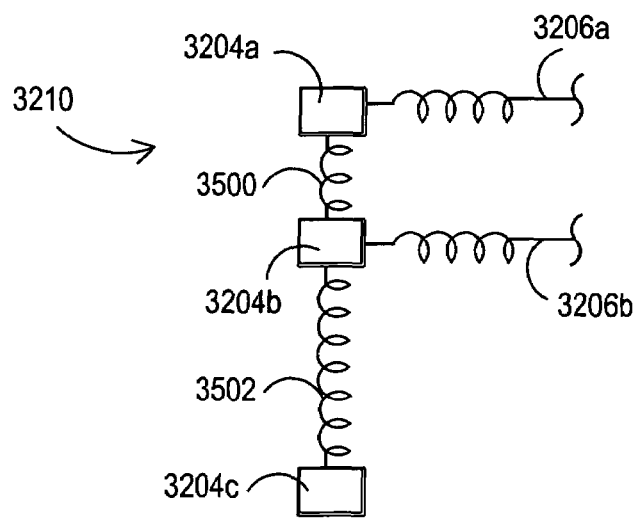
FIG. 7B is a simplified partial electrical schematic of one of the induction loop circuits of FIG. 7A.

FIG. 7B shows a partial and simplified schematic of induction loop circuit 3210 of FIG. 7A, showing substrate inductor circuit bonding pad 3204a connected to inductor circuit wire bond 3206a, and second individual substrate inductor circuit bonding pad 3204b connected to second inductor circuit wire bond 3206b, and each of the two individual inductor circuit bonding pads 3204a and 3204b connected on or within package substrate 3200 with conductive inductor circuit connection feature 3500 (not shown explicitly in FIG. 7A) to complete the induction loop circuit with a material of desired inductance value. As may be seen, substrate inductor bonding pad 3204c is also connected to substrate inductor bonding pad 3204b on or within package substrate 3200 with conductive feature 3502 (not shown explicitly in FIG. 7A) having a material of desired inductance value. Provision of an additional substrate inductor bonding pad 3204c allows for selective connection of inductor circuit wire bonds 3206a and 3206b to any respective two of substrate inductor bonding pads 3204a, 3204b, or 3204c, thus allowing for the selective inclusion of either conductive feature 3500 or 3502 in induction loop circuit 3210. Additionally, both conductive inductor circuit connection features 3500 and 3502 may be included in-series in induction loop circuit 3210 by, for example, connecting first inductor circuit wire bond 3206a to substrate inductor bonding pad 3204a, and connecting second inductor circuit wire bond 3206b to substrate inductor bonding pad 3204c. It will be understood with benefit of this disclosure that an additional number of selectable inductance values may be provided for in a similar manner by providing as many alternative substrate inductor bonding pads as desired (for example, n alternate substrate inductor bonding pads) with a corresponding number (for example, n–1) of selectable conductive inductor circuit connection features connected therebetween. Furthermore, it will be understood that selectable inductance values may be so provided for using any suitable package substrate type and/or substrate electrical contact type known in the art, including those described elsewhere herein. The inductance value between alternative selected pairs of substrate inductor circuit bonding pads may vary or be varied due to differing geometry, material, and/or length of inductive connective features disposed between a selected pair of substrate inductor circuit bonding pads.

Figure 8:
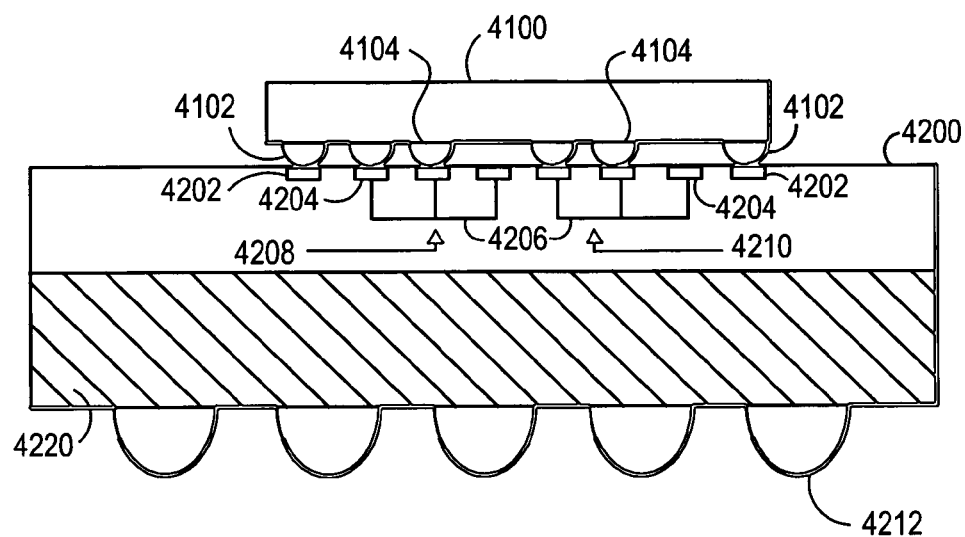
FIG. 8 is a simplified cross sectional view of a frequency synthesizer package having alternative package substrate inductor circuit bonding pads and multiple induction loop circuits according to one embodiment of the present invention.

In yet another embodiment, package substrate bonding pads may be electrically coupled to one another on or within a package substrate and be suitable for connection with solder bumps, for example, on a flip chip. Such an embodiment is illustrated in FIG. 8. FIG. 8 shows "flip chip" integrated circuit 4100 mounted to package substrate 4200 on a package carrier 4220 (e.g., ceramic chip carrier, etc.). In the illustrated embodiment, package substrate 4200 includes a plurality of package substrate I/O electrical bonding pads 4202 provided on the upper surface of package substrate 4200 for input/output connection with one or more circuits contained within integrated circuit 4100. Within package substrate 4200 and package carrier 4220, provision is made for electrical connection of substrate bonding pads 4202 to off-package circuitry (not shown), such as a printed circuit board. Examples of such provision include, but are not limited to, electrically conductive vias (not shown) connected to substrate bonding pads 4202 and extending through package carrier 4220 to substrate solder bump connections 4212 provided on the underside of package substrate 4200. Integrated circuit solder bumps 4102 are shown for electrically connecting substrate bonding pads 4202 to one or more circuits contained within integrated circuit 4100.

Also shown in FIG. 8 are two sets of alternative package substrate inductor circuit bonding pads 4204 to which connection to VCO circuitry contained within or on integrated circuit 4100 is made by inductor circuit solder bump connectors 4104, to complete two induction loop circuits 4208 and 4210. In the exemplary embodiment shown, a respective conductive inductor circuit connection feature segment 4206 is connected between each pair of inductor circuit substrate bonding pads 4204 as shown. Each conductive inductor circuit connection feature segment 4206 extends from a substrate inductor circuit bonding pad 4204 to another substrate inductor circuit bonding pad 4204, and has an inductive value defined (e.g., by its geometry, material and/or length) between the respective substrate inductor circuit bonding pads 4204 to which it is connected.

As shown in the exemplary embodiment of FIG. 8, each induction loop circuit 4208 and 4210 is provided with three alternative substrate inductor circuit bonding pads, in each case connected together by respective conductive inductor circuit connection feature segments 4206. In this way, inductive value of each of respective induction loop circuits 4208 and 4210 may be selectably determined by the selected placement of integrated circuit inductor solder bumps 4104. For example, FIG. 8 shows placement of integrated circuit inductor circuit solder bumps 4104 such that contact is made between two adjacent substrate inductor circuit bonding pads 4204 to complete a closed circuit for each of induction loop circuits 4208 and 4210. Alternatively, FIG. 9 shows induction loop circuit 4208 formed by selective placement of integrated circuit inductor solder bumps 4104 for connection with respective substrate inductor circuit bonding pads 4204 that lie on either side of a substrate inductor circuit bonding pad 4204 that is unconnected to a solder bump 4104, thus creating an induction loop circuit 4208 that includes a longer conductive inductor circuit connection feature segment 4206 than does the corresponding induction loop circuit 4208 shown in FIG. 8.

Figure 9:
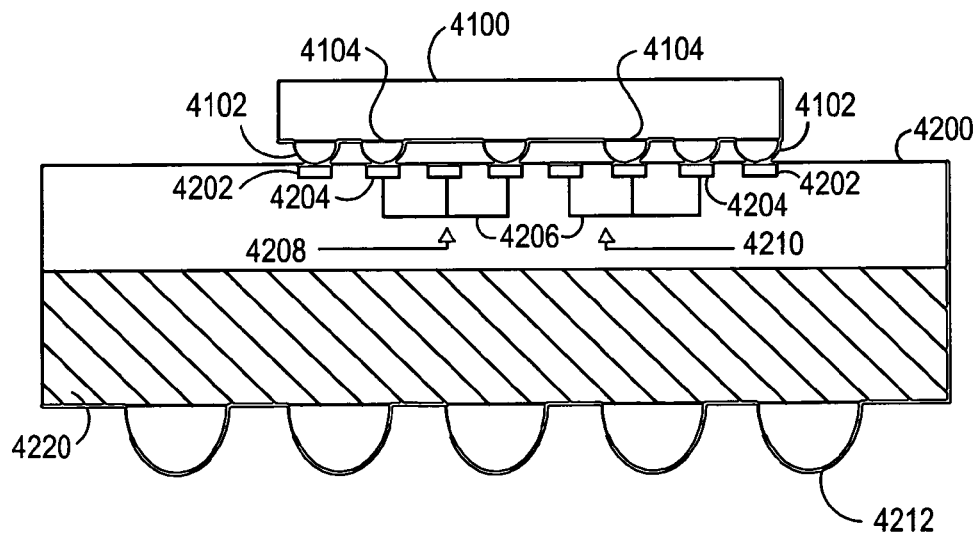
FIG. 9 is a simplified cross sectional view of a frequency synthesizer package having alternative package substrate inductor circuit bonding pads and multiple induction loop circuits according to one embodiment of the present invention.

Also shown in FIG. 9 is an induction loop circuit 4210 having integrated circuit inductor circuit solder bumps 4104 that are selectively placed to complete induction loop circuit 4210 with a different conductive inductor circuit connection feature segment 4206 than was connected in the corresponding circuit of FIG. 8. Once again, the inductance value between alternative selected pairs of substrate inductor circuit bonding pads may vary or be varied due to differing geometry, material, and/or length of inductive connective feature 4206 disposed between a selected pair of substrate inductor circuit bonding pads.

Figure 10:
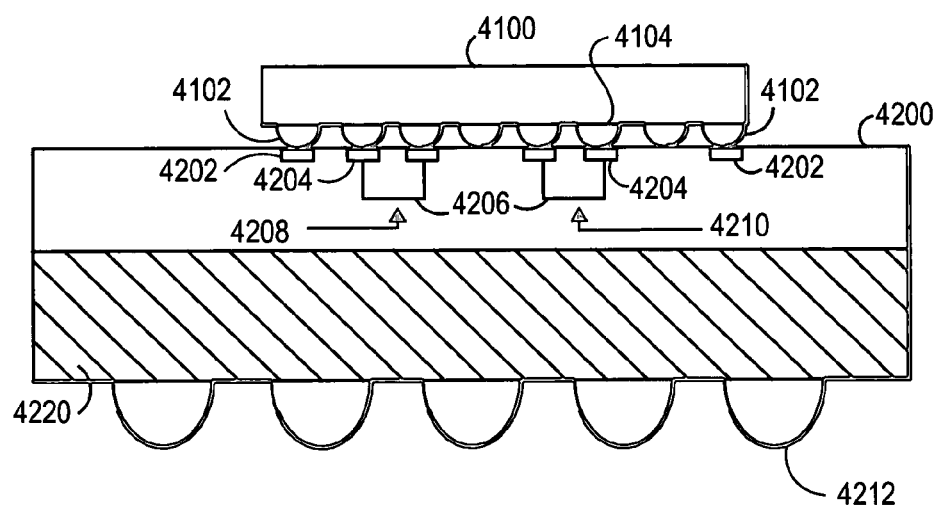
FIG. 10 is a simplified cross sectional view of a frequency synthesizer package having alternative package substrate inductor circuit bonding pads and multiple induction loop circuits according to one embodiment of the present invention.
Figure 11:
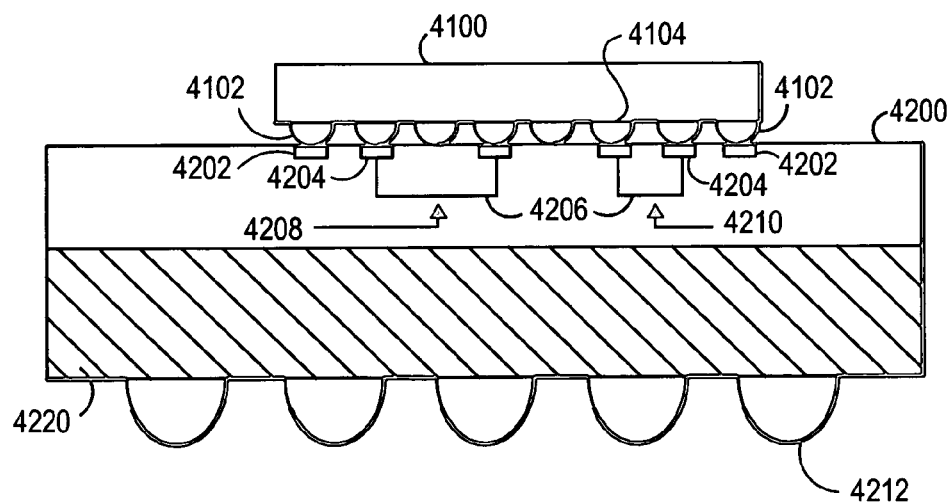
FIG. 11 is a simplified cross sectional view of a frequency synthesizer package having alternative package substrate inductor circuit bonding pads and multiple induction loop circuits according to one embodiment of the present invention.

Although FIGS. 8 and 9 illustrate specific exemplary embodiments in which selective placement of integrated circuit inductor circuit solder bumps 4104 are provided on integrated circuit 4100 to provide selectable inductance values, it will be understood that benefit of the disclosed method and apparatus may also be realized by selective or strategic placement of substrate inductor circuit bonding pads, as shown in FIGS. 10 and 11. In this regard, FIGS. 10 and 11 illustrate how induction loop circuits 4208 and 4210 may be connected to one or more VCO circuits within integrated circuit 4100 to have the same inductance values as corresponding induction loop circuits 4208 and 4210 depicted in respective FIGS. 8 and 9, by varying placement of substrate inductor circuit bonding pads 4204 rather than integrated circuit inductor circuit solder bumps 4101. As may be seen in the exemplary embodiment of FIGS. 10 and 11, integrated circuit inductor circuit solder bumps 4101 are present in all possible bonding locations, and it is presence of selected substrate inductor circuit bonding pads 4204 at particular locations that determines the selected induction value and/or VCO circuit connection path.

Figure 12:
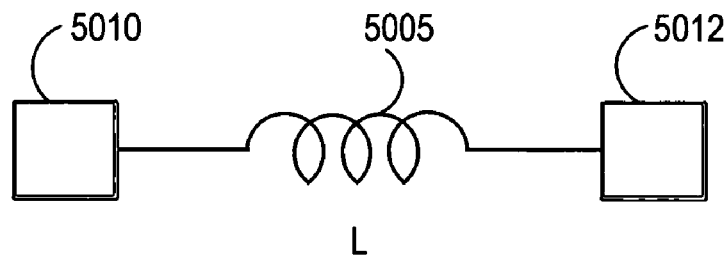
FIG. 12 shows an electrical schematic of a wire bond induction loop circuit.

One may connect in-package (wire bond) inductors or induction circuits in series, parallel, or a combination of series and parallel, to obtain a wide variety of inductor topologies and arrangements. FIG. 12 shows an electrical schematic of a wire bond induction loop circuit. The schematic includes inductor 5005 (L), pad 5010, and pad 5012. One terminal of inductor 5005 couples to pad 5010, whereas a second terminal of inductor 5005 couples to pad 5012. One may realize inductor 5005 as the parallel combination of two inductors. In other words, one may couple two inductors in parallel such that the inductance between the two resulting terminals of the parallel combination equals the inductance of inductor 5005.

Figure 13:
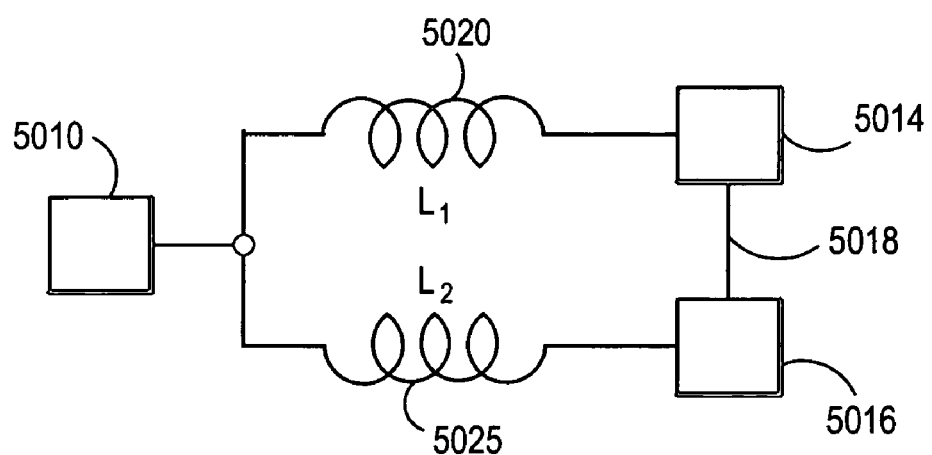
FIG. 13 illustrates an electrical schematic of two inductors coupled in parallel, wherein each inductor may constitute a wire bond induction loop circuit according to the invention.

FIG. 13 illustrates an electrical schematic of two inductors coupled in parallel. One terminal of Inductor 5020 ($L_1$) and one terminal of inductor 5025 ($L_2$) couple to pad 5010. A second terminal of inductor 5020 couples to pad 5014, and a second terminal of inductor 5025 couples to pad 5016. Lead (e.g., metal trace on an integrated circuit) 5018 couples pad 5014 to pad 5016. The inductors may constitute in-package wire bond inductors, and the pads may be package and/or integrated circuit bonding pads. Note that, rather than using pads 5014 and 5016 and lead 5018, one may use a single pad to couple the second terminals of inductors 5020 and 5025 (similar to pad 5010 for the first terminals of inductors 5020 and 5025).

One may select inductance values of inductor 5020 and inductor 5025 such that one obtains the resulting overall inductance, L, as:

$$L = \frac{L_1 \cdot L_2}{L_1 + L_2}.$$

The inductance looking into the circuit coupling pad 5010 to lead 5018 equals L, the inductance of inductor 5005. Put another way, the arrangement in FIG. 13 that uses two inductors according to the above equation has the same inductance as the single inductor in FIG. 12.

RF circuitry such as frequency synthesizers often operate in electromagnetically and electrically noisy environments, for example, in the vicinity of digital switching noise and currents. By using parallel wire bond inductors instead of a single wire bond inductor, one may reduce the effects of the noise and interference.

Figure 14:
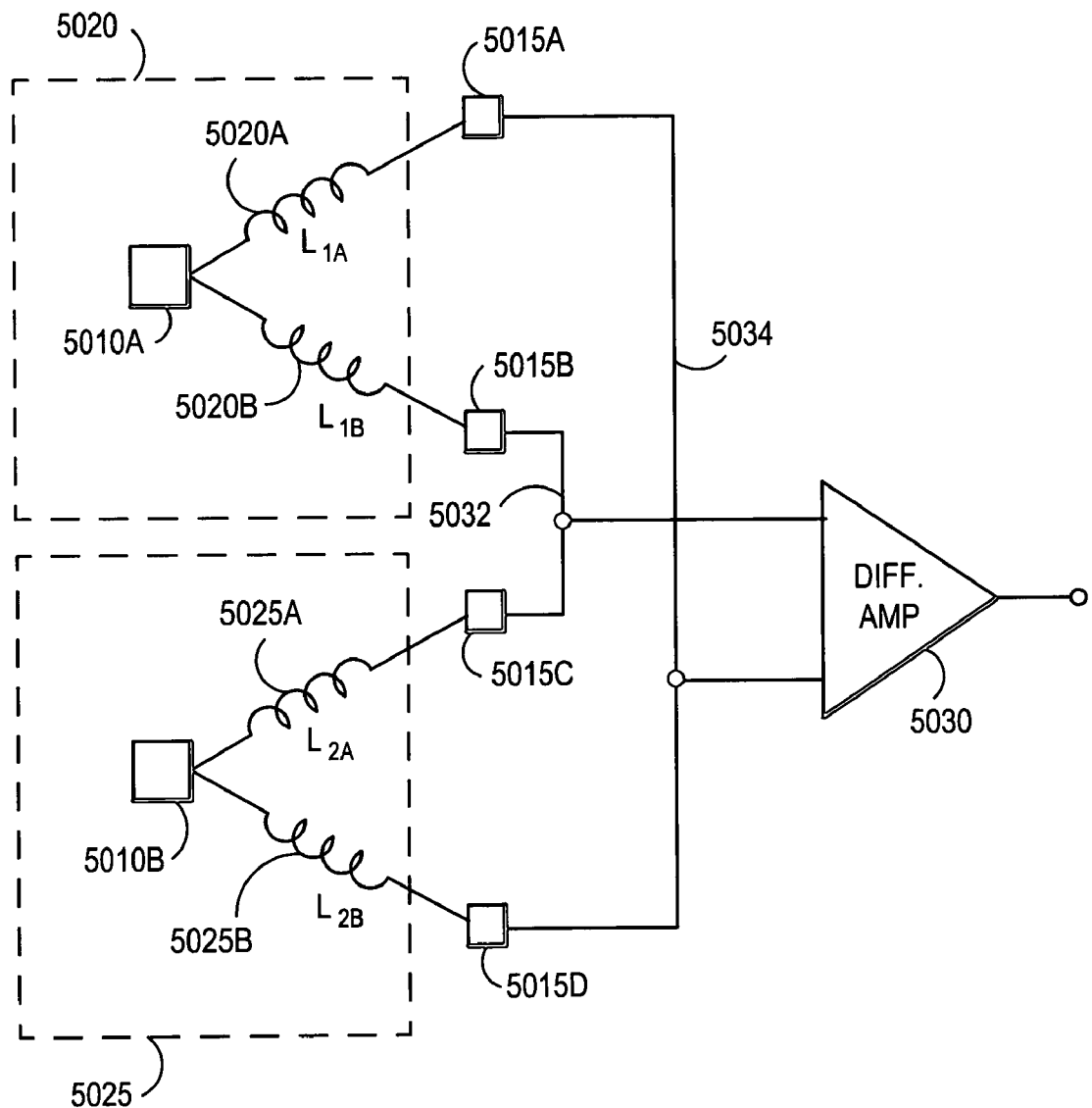
FIG. 14 depicts an exemplary embodiment according to the invention that includes two inductors coupled in parallel.

FIG. 14 shows the parallel coupling of two wire bond inductors, each of which includes two wire bond inductor segments coupled in series via a bonding pad. Inductor segment 5020A ($L_{1A}$) couples between pad 5015A and pad 5010A. Inductor segment 5020B ($L_{1B}$) couples between pad 5015B and pad 5010A. Similarly, inductor segment 5025A ($L_{2A}$) couples between pad 5015C and pad 5010B. Inductor segments 5025B ($L_{2B}$) couples between pad 5015D and pad 5010B.

One may select the inductance of inductor segments 5020A, 5020B, 5025A, and 5025B such that: (i) the inductance of the series combination of inductor segments 5020A and 5020B equals $L_1$, the inductance of inductor 5020 (see FIG. 13), and (ii) the inductance of the series combination of inductor segments 5025A and 5025B equals $L_2$, the inductance of inductor 5020 (see FIG. 13). In other words:

$$L_1 = L_{1A} + L_{1B},$$

and $$L_2 = L_{2A} + L_{2B}.$$

Lead 5032 couples pad 5015B to pad 5015C. Likewise, lead 5034 provides electrical coupling between pad 5015A and pad 5015D.

Suppose that an interfering source (say, from digital switching currents in proximity to the inductance structure of FIG. 14) produces a magnetic field with increasing intensity that enters the page in a perpendicular fashion. The interfering magnetic field induces a current flowing in the counter-clockwise direction in the series combination of inductor segments 5020A and 5020B. Likewise, the magnetic field induces a current, also flowing in the counter-clockwise direction, in the series combination of inductor segments 5025A and 5025B. In other words, the induced currents flow in inductor segments 5020A-5020B and 5025A-5025B in such a direction as to oppose the interfering source.

The particular manner of coupling in parallel the inductor segments that make up inductances $L_1$ and $L_2$ (i.e., the geometric symmetry in the structure of the inductor segments in FIG. 14) and the coupling of pad 5015A to pad 5015D and pad 5015B to pad 5015C causes the voltage at pads 5015A and 5015D to rise by an amount substantially the same as the voltage rise at pads 5015B and 5015C. In other words, the interfering magnetic field causes the generation of a common-mode voltage at pads 5015A–5015D.

One may reduce the effect of the resulting common-mode voltage on noise-sensitive circuitry by using signal-processing techniques. The embodiment shown in FIG. 14 employs a differential amplifier 5030 that rejects common-mode voltages. By applying the leads 5032 and 5034 to the inputs of the differential amplifier 5030, one may amplify the desired (i.e., differential) signal present at the inputs of the differential amplifier 5030, yet attenuate the effects of the undesired common-mode voltage (by taking advantage of the common-mode rejection capabilities of differential amplifier 5030) that results from the electromagnetic interference.

Figure 15:
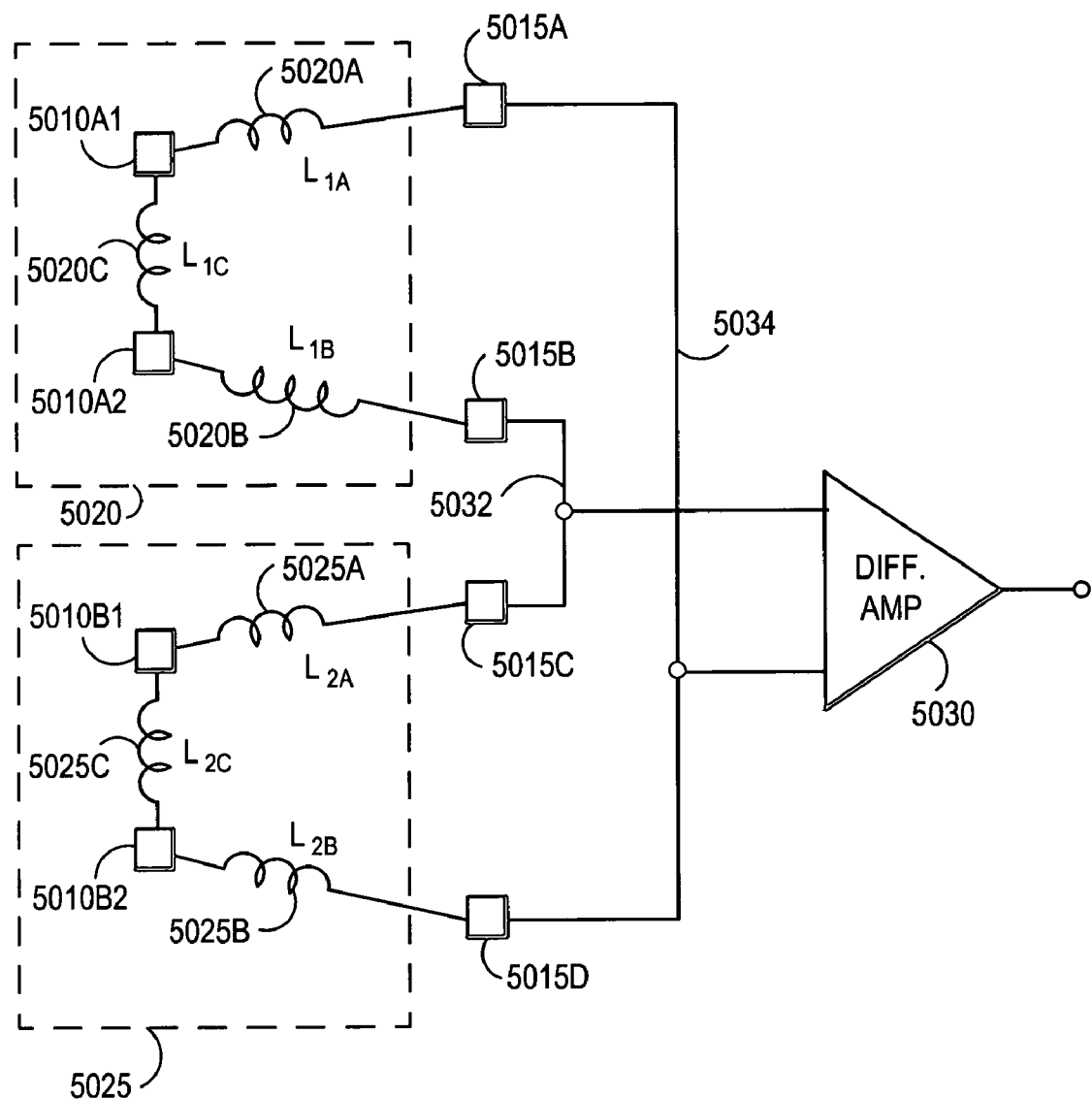
FIG. 15 shows another exemplary embodiment according to the invention that includes two inductors coupled in parallel.

Note that, rather than using two inductor segments to realize one of the parallel inductors (e.g., inductors 5020A and 5020B to realize inductor $L_1$), one may use one or more inductor segments to realize a given inductor. FIG. 15 depicts an exemplary embodiment where the series coupling of three inductor segments 5020A, 5020C, and 5020B via pads 5010A1 and 5010A2 provides one of the parallel inductors, with an overall inductance $L_1$. Likewise, the series coupling of three inductor segments 5025A, 5025C, and 5025B via pads 5010B1 and 5010B2 provides the second of the parallel inductors, with an overall inductance $L_2$. Again, because of the symmetry of the arrangement of the components, one may use differential amplifier 5030 to reduce the effects of interference by attenuating the conmmon-mode voltage corresponding to electromagnetic interference, as described above.

One may advantageously use in-package wire bond inductors to implement the inductor arrangements described above in connection with FIGS. 13–15. FIGS. 16–23 illustrate exemplary embodiments of various implementations of the parallel symmetrical wire bond arrangements according to the invention.

As one alternative, one may use integrated circuit and package substrate inductor circuit bonding pads together with inductor circuit wire bonds to realize the parallel inductor arrangements described above. FIGS. 16–19 provide examples of such embodiments. Generally, FIGS. 16–19 implement parallel symmetrical wire bond inductor arrangements using the basic package and wire bond inductor circuits shown in FIGS. 5–7 and described above.

Figure 16:
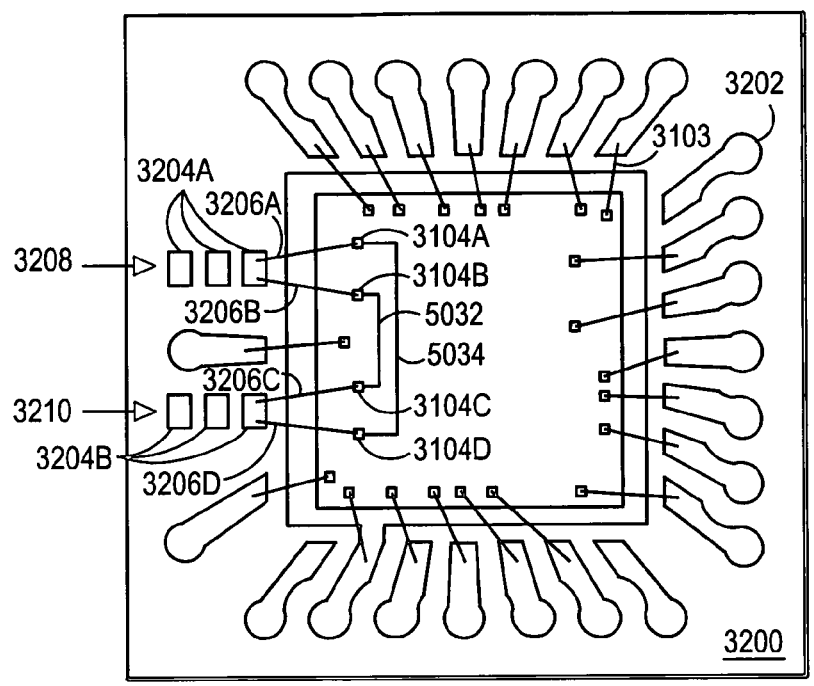
FIG. 16 illustrates one embodiment according to the invention of a portion of a semiconductor package that includes parallel wire bond inductors.

FIG. 16 shows one embodiment of a portion of a semiconductor package 3200 that includes symmetrical parallel wire bond inductors. The arrangement in package 3200 corresponds electrically to the schematic shown in FIG. 14.

The package 3200 includes induction loop circuits 3208 and 3210, which correspond to inductors 5020 and 5025, respectively. Induction loop 3208 includes inductor circuit wire bonds 3206A and 3206B, which correspond, respectively, to inductor segments 5020A and 5020B. Similarly, induction loop 3210 includes inductor circuit wire bonds 3206C and 3206D that represent inductor segments 5025A and 5025B, respectively. Integrated circuit inductor circuit bonding pads 3104A–3104D represent pads 5015A–5015D, respectively. Package substrate inductor circuit bonding pads 3204A–3204B correspond, respectively, to pads 5010A–5010B.

Leads 5032 and 5034 couple induction loop circuits 3208 and 3210 in parallel to electrically realize the circuit arrangement shown in FIG. 14. Leads 5032 and 5034 may constitute any suitable coupling, such as circuit traces or conductive material in conjunction with vias, as desired. Inputs of a differential amplifier (not shown explicitly) may couple to leads 5032 and 5034.

Note that, although FIG. 16 shows a set of three package substrate inductor circuit bonding pads 3204A and a set of three package substrate inductor circuit bonding pads 3204B, one may generally use one or more sets of package substrate inductor circuit bonding pads 3204A and 3204B, as desired. As noted above in connection with FIGS. 5–7, one may vary the inductance of induction loop circuits 3208 and 3210 by using various combinations and selections, for example, by varying the selection or combinations of the package substrate inductor circuit bonding pads 3204A and 3204B.

FIG. 16 shows an embodiment that uses the right-most set of package substrate inductor circuit bonding pads 3204A and 3204B. One, however, may use other sets of package substrate inductor circuit bonding pads 3204A and 3204B to realize, respectively, induction loop circuits 3208 and 3210, as desired. As one exemplary embodiment, FIG. 17 illustrates using the left-most package substrate inductor circuit bonding pads 3204A and 3204B to implement the induction loop circuits 3208 and 3210, respectively.

Figure 18:
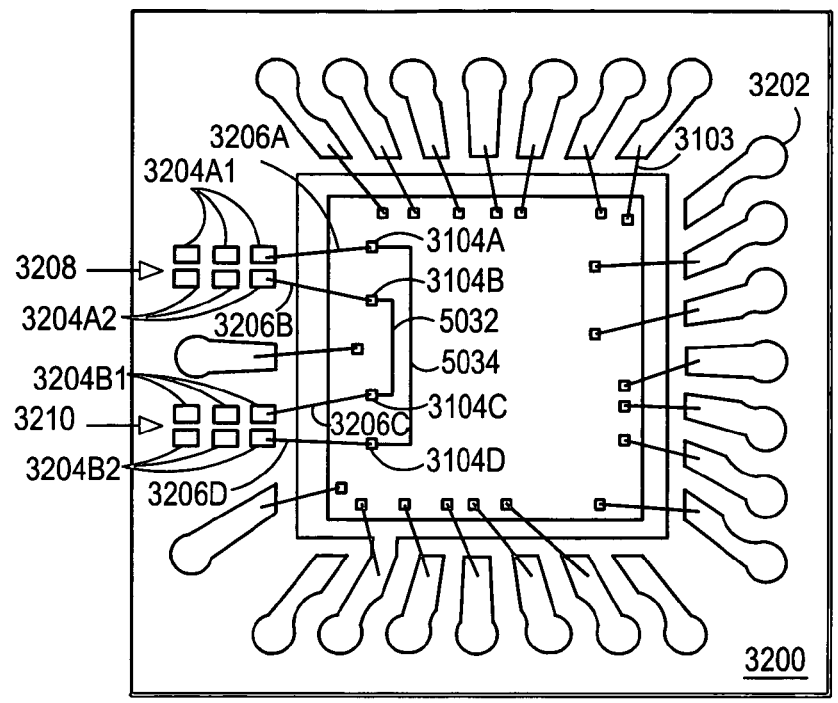
FIG. 18 shows yet another embodiment according to the invention of a portion of a semiconductor package that includes parallel wire bond inductors.

FIG. 18 shows another embodiment of a portion of a semiconductor package 3200 that includes symmetrical parallel wire bond inductors. The arrangement in package 3200 corresponds electrically to the schematic shown in FIG. 15, which uses three inductor segments to implement each of the two parallel inductors.

The package 3200 includes induction loop circuits 3208 and 3210, which correspond to inductors 5020 and 5025 in FIG. 15, respectively. Leads 5032 and 5034 couple induction loop circuits 3208 and 3210 in parallel to electrically realize the circuit arrangement shown in FIG. 15. As noted above, leads 5032 and 5034 may constitute any suitable coupling, such as circuit traces or conductive material in conjunction with vias, as desired. Integrated circuit inductor circuit bonding pads 3104A–3104D represent pads 5015A–5015D, respectively.

Figure 17:
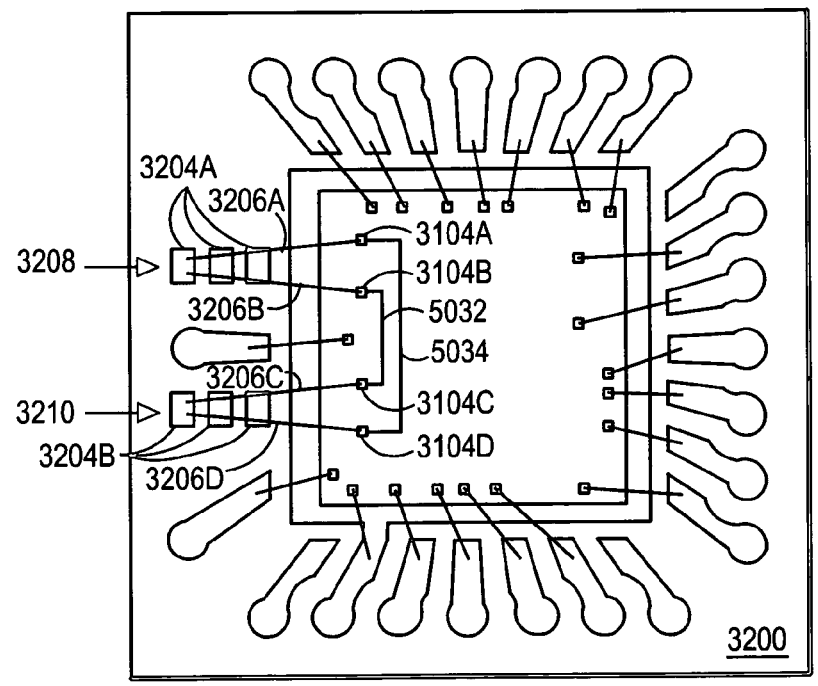
FIG. 17 depicts another embodiment according to the invention of a portion of a semiconductor package that includes parallel wire bond inductors.

Unlike FIGS. 16–17, the embodiment in FIG. 18 uses individual substrate inductor circuit bonding pads 3204A1, 3204A2, 3204B1, and 3204B2. Individual package substrate inductor circuit bonding pads 3204A1, 3204A2, 3204B1, and 3204B2 correspond, respectively, to pads 5010A1, 5010A2, 5010B1, and 5010B2 in FIG. 15.

Induction loop 3208 includes inductor circuit wire bonds 3206A and 3206B and conductive inductor circuit connection feature 3500A (not shown explicitly), which correspond, respectively, to inductor segments 5020A, 5020B, and 5020C. Conductive inductor circuit connection feature 3500A couples one of individual substrate inductor circuit bonding pads 3204A1 to one of individual substrate inductor circuit bonding pads 3204A2. Similarly, induction loop 3210 includes inductor circuit wire bonds 3206C and 3206D and conductive inductor circuit connection feature 3500B (not shown explicitly) that represent inductor segments 5025A, 5025B, and 5025C, respectively. Conductive inductor circuit connection feature 3500B couples one of individual substrate inductor circuit bonding pads 3204B1 to one of individual substrate inductor circuit bonding pads 3204B2.

Note that, although FIG. 18 shows a set of three pairs of individual substrate inductor circuit bonding pads 3204A1–3204A2 and a set of three pairs of individual substrate inductor circuit bonding pads 3204B1–3204B2, one may generally use one or more sets of individual substrate inductor circuit bonding pads 3204A1–3204A2 and 3204B1–3204B2, as desired.

Figure 19:
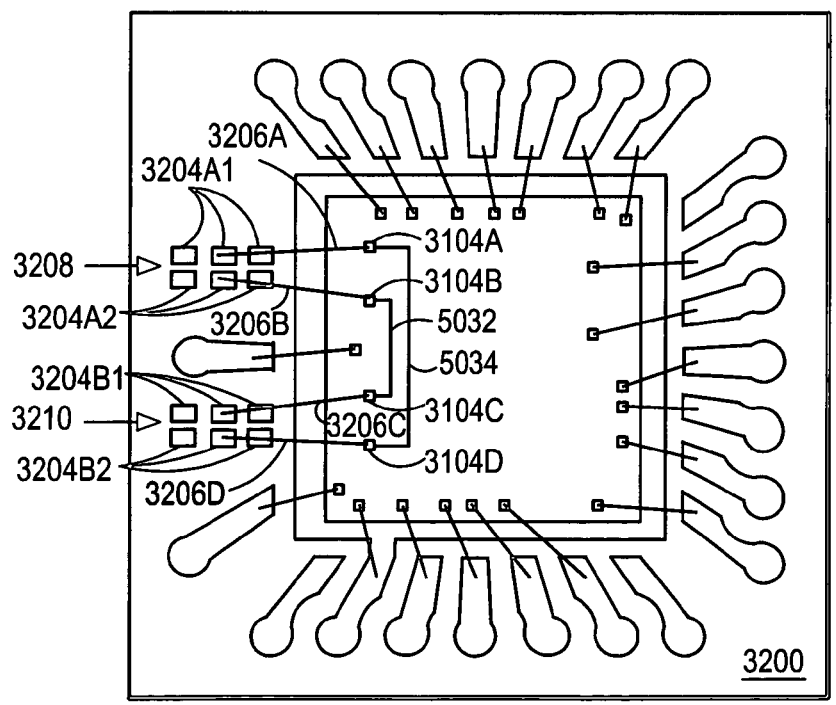
FIG. 19 illustrates a further embodiment according to the invention of a portion of a semiconductor package that includes parallel wire bond inductors.

As noted above in connection with FIGS. 5–7 and 16–17, one may vary the inductance and other characteristics (e.g., loop area, resistance) of induction loop circuits 3208 and 3210 by using various combinations and selections of the individual substrate inductor circuit bonding pads 3204A1–3204A2 and 3204B1–3204B2, as desired. FIG. 18, for example, shows an embodiment that uses the right–most set of individual substrate inductor circuit bonding pads 3204A1–3204A2 and 3204B1–3204B2. One, however, may use other sets of individual substrate inductor circuit bonding pads 3204A1–3204A2 and 3204B1–3204B2 to realize, respectively, induction loop circuits 3208 and 3210, as desired. As another exemplary embodiment, FIG. 19 illustrates using the middle individual substrate inductor circuit bonding pads 3204A1–3204A2 and 3204B1–3204B2 to implement the induction loop circuits 3208 and 3210, respectively.

In other exemplary embodiments, one may use package substrate bonding pads may be electrically coupled to one another on or within a package substrate with solder bumps, for example, on a flip chip, to implement the parallel symmetrical wire bond inductor arrangements described above. FIGS. 20–23 provide examples of such embodiments. Generally, FIGS. 20–23 implement parallel symmetrical wire bond inductor arrangements using the basic package and wire bond inductor circuits shown in FIGS. 8–11 and described above.

Figure 20:
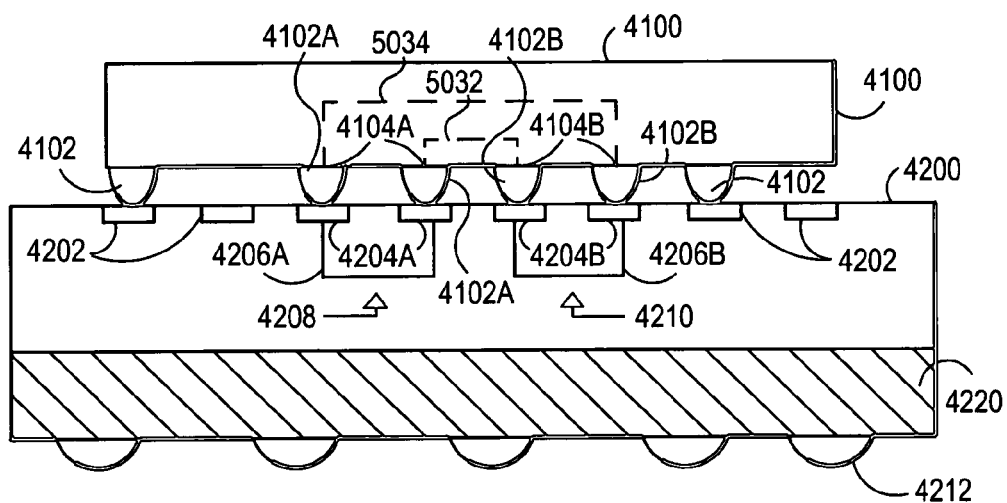
FIG. 20 depicts a simplified cross section view of a semiconductor package that uses integrated circuit solder bumps and package substrate inductor circuit bonding pads to implement two parallel induction loop circuits according to one embodiment of the invention.

FIG. 20 shows an embodiment that employs selective or strategic placement of integrated circuit solder bumps 4102A and 4102B in order to implement induction loop circuits 4208 and 4210, similar to the embodiments in FIGS. 8–11. The embodiment in FIG. 20 includes substrate bonding pads 4202 and inductor circuit substrate bonding pads 4204A and 4204B. Selective or strategic placement of integrated circuit solder bumps 4102A and 4102B and inductor circuit solder bump connectors 4104A and 4104B, allows implementation of parallel induction loop circuits 4208 and 4210 with desired inductance values.

Induction loop circuits 4208 and 4210 each correspond to one of the two parallel inductors (see, for example, inductors 5020 and 5025 in FIG. 13). Induction loop circuit 4208 includes conductive inductor circuit connection feature segment 4206A, which couples at its terminals to inductor circuit substrate bonding pads 4204A. Similarly, induction loop circuit 4210 includes conductive inductor circuit connection feature segment 4206B. Conductive inductor circuit connection feature segment 4206B couples at its terminals to inductor circuit substrate bonding pads 4204B. Generally, the conductive inductor circuit connection feature segments may constitute a suitable material, such as wire, strip, or trace, of a desired length, cross-section, shape, etc., to implement induction loop circuits with desired characteristics, as persons skilled in the art who have the benefit of the description of the invention understand.

Inductor circuit substrate bonding pads 4204A couple to the flip-chip integrated circuit 4100 through inductor circuit solder bump connectors 4104A and integrated circuit solder bumps 4102A. Similarly, inductor circuit substrate bonding pads 4204B couple to the integrated circuit 4100 through inductor circuit solder bump connectors 4104B and integrated circuit solder bumps 4102B. Leads 5032 and 5034 couple induction loop circuits 4208 and 4210 in parallel. Leads 5032 and 5034 may constitute any suitable coupling, such as circuit traces or conductive material in conjunction with vias, as desired. Inputs of a differential amplifier (not shown explicitly) may couple to leads 5032 and 5034.

Note that, similar to FIGS. 8–9, the embodiment in FIG. 20 uses strategic or selective placement of integrated circuit solder bumps. As an alternative, one may employ selective or strategic placement of inductor circuit substrate bonding pads, as desired.

Figure 21:
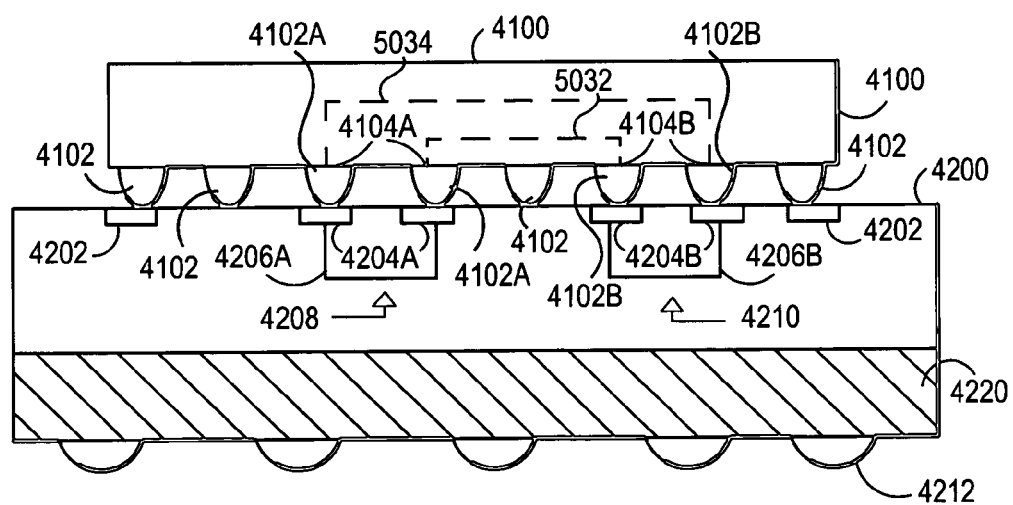
FIG. 21 shows a simplified cross section view of a semiconductor package that uses integrated circuit solder bumps and package substrate inductor circuit bonding pads to implement two parallel induction loop circuits according to another embodiment of the invention.

FIG. 21 illustrates an embodiment that employs selective or strategic placement of inductor circuit substrate bonding pads 4204A and 4204B in order to implement induction loop circuits 4208 and 4210, similar to the embodiments in FIGS. 10–11. The embodiment in FIG. 21 includes integrated circuit solder bumps 4102 and 4102A–4102B, inductor circuit solder bump connectors 4104A–4104B, substrate bonding pads 4202, and inductor circuit substrate bonding pads 4204A and 4204B. Selective or strategic placement of inductor circuit substrate bonding pads 4204A and 4204B allows implementation of parallel induction loop circuits 4208 and 4210 with desired inductance values.

Induction loop circuits 4208 and 4210 each correspond to one of the two parallel inductors (see, for example, inductors 5020 and 5025 in FIG. 13). Induction loop circuit 4208 includes conductive inductor circuit connection feature segment 4206A, which couples at its terminals to inductor circuit substrate bonding pads 4204A. Similarly, induction loop circuit 4210 includes conductive inductor circuit connection feature segment 4206B. Conductive inductor circuit connection feature segment 4206B couples at its terminals to inductor circuit substrate bonding pads 4204B. Generally, the conductive inductor circuit connection feature segments may constitute a suitable material, such as wire, strip, or trace, of a desired length, cross-section, shape, etc., to implement induction loop circuits with desired characteristics, as persons skilled in the art who have the benefit of the description of the invention understand.

Inductor circuit substrate bonding pads 4204A couple to the flip-chip integrated circuit 4100 through inductor circuit solder bump connectors 4104A and integrated circuit solder bumps 4102A. Similarly, inductor circuit substrate bonding pads 4204B couple to the integrated circuit 4100 through inductor circuit solder bump connectors 4104B and integrated circuit solder bumps 4102B. Leads 5032 and 5034 couple induction loop circuits 4208 and 4210 in parallel. Leads 5032 and 5034 may constitute any suitable coupling, such as circuit traces or conductive material in conjunction with vias, as desired. Inputs of a differential amplifier (not shown explicitly) may couple to leads 5032 and 5034.

Figure 22:
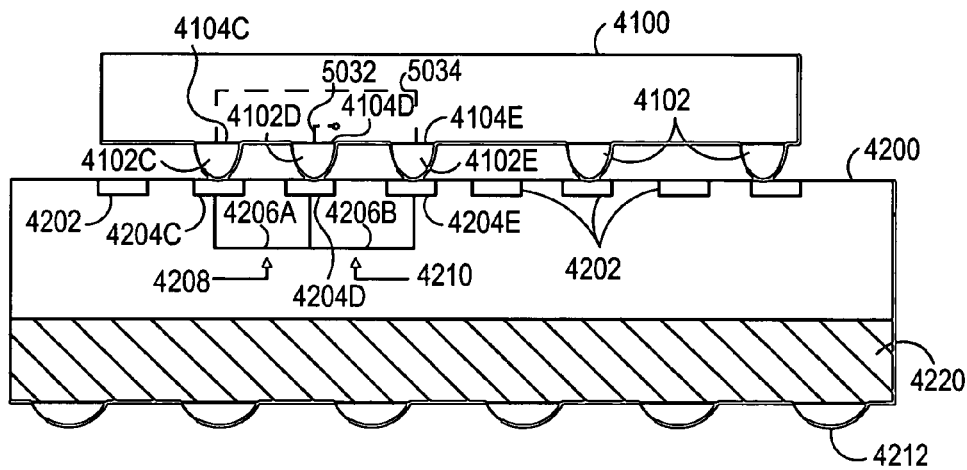
FIG. 22 illustrates a simplified cross section view of a semiconductor package that uses integrated circuit solder bumps and package substrate inductor circuit bonding pads to implement two parallel induction loop circuits according to yet another embodiment of the invention.
Figure 23:
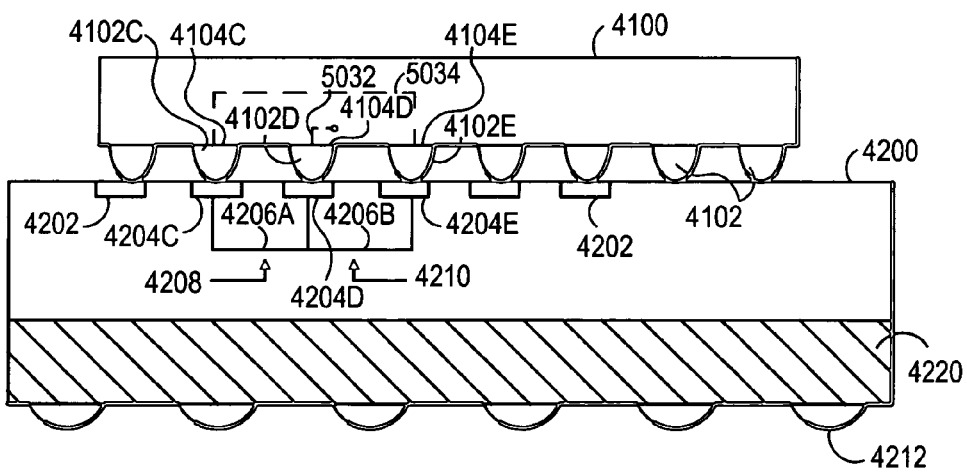
FIG. 23 depicts a simplified cross section view of a semiconductor package that uses integrated circuit solder bumps and package substrate inductor circuit bonding pads to implement two parallel induction loop circuits according to a further embodiment of the invention.

Note that in the embodiments shown in FIGS. 20–21, each of the two induction loop circuits 4208 and 4210 has its own set of two substrate bonding pads, two integrated circuit solder bumps, and two inductor circuit solder bump connectors. One, however, may employ a more compact parallel inductor arrangement by sharing common bonding pads, integrated circuit solder bumps, and inductor circuit solder bump connectors, as desired. FIGS. 22–23 illustrate two such exemplary embodiments.

FIG. 22 shows an embodiment that uses strategic or selective placement of integrated circuit solder bumps, similar to FIGS. 8–9 and 20. On the other hand, FIG. 23 illustrates an alternative embodiment that employs selective or strategic placement of inductor circuit substrate bonding pads, as do FIGS. 10–11 and 21.

The embodiment in FIG. 22 includes induction loop circuits 4208 and 4210. The embodiment in FIG. 22 further includes substrate bonding pads 4202 and inductor circuit substrate bonding pads 4204C–4204E. Selective or strategic placement of integrated circuit solder bumps 4102C–4102E and inductor circuit solder bump connectors 4104C–4104E allows implementation of parallel induction loop circuits 4208 and 4210 with desired inductance values.

Induction loop circuits 4208 and 4210 each correspond to one of the two parallel inductors (see, for example, inductors 5020 and 5025 in FIG. 13). Induction loop circuit 4208 includes conductive inductor circuit connection feature segment 4206A, which couples at its respective terminals to inductor circuit substrate bonding pads 4204C and 4204D. Similarly, induction loop circuit 4210 includes conductive inductor circuit connection feature segment 4206B. Conductive inductor circuit connection feature segment 4206B couples at its respective terminals to inductor circuit substrate bonding pads 4204D and 4204E.

Inductor circuit substrate bonding pads 4204C–4204E couple to the flip-chip integrated circuit 4100 through inductor circuit solder bump connectors 4104C–4104E and integrated circuit solder bumps 4102C–4102E, respectively. Lead 5034 couples together inductor circuit solder bump connectors 4104C and 4104E. Inductive loop circuits 4208 and 4210 electrically couple together in a parallel fashion because of the coupling through lead 5034 and because one terminal of each of conductive inductor circuit connection feature segments 4206A and 4206B couple to each other and to lead 5032. Lead 5032 couples to the inductor circuit solder bump connector 4104D and, hence, to integrated circuit solder bump 4102D. Leads 5032 and 5034 may constitute any suitable coupling, such as circuit traces or conductive material in conjunction with vias, as desired. Inputs of a differential amplifier (not shown) may couple to leads 5032 and 5034, as desired. Note that inductive loop circuits 4208 and 4210 share inductor circuit substrate bonding pad 4204D, integrated circuit solder bump 4102D, and inductor circuit solder bump connector 4104D.

As noted above, FIG. 23 illustrates an embodiment that employs selective or strategic placement of inductor circuit substrate bonding pads 4204C–4204E in order to implement induction loop circuits 4208 and 4210, similar to the embodiments in FIGS. 10–11 and 21. The embodiment in FIG. 23 includes integrated circuit solder bumps 4102 and 4102C–4102E, inductor circuit solder bump connectors 4104C–4104E, substrate bonding pads 4202, and inductor circuit substrate bonding pads 4204C–4204E. Selective or strategic placement of inductor circuit substrate bonding pads 4204C–4204E allows implementation of parallel induction loop circuits 4208 and 4210 with desired inductance values.

Induction loop circuits 4208 and 4210 each correspond to one of the two parallel inductors (see, for example, inductors 5020 and 5025 in FIG. 13). Induction loop circuit 4208 includes conductive inductor circuit connection feature segment 4206A, which couples at its respective terminals to inductor circuit substrate bonding pads 4204C and 4204D. Similarly, induction loop circuit 4210 includes conductive inductor circuit connection feature segment 4206B. Conductive inductor circuit connection feature segment 4206B couples at its respective terminals to inductor circuit substrate bonding pads 4204D and 4204E. As noted above, the conductive inductor circuit connection feature segments may generally constitute a suitable material, such as wire, strip, or trace, of a desired length, cross-section, shape, etc., to implement induction loop circuits with desired characteristics, as persons skilled in the art who have the benefit of the description of the invention understand.

Inductor circuit substrate bonding pads 4204C–4204E couple to the flip-chip integrated circuit 4100 through inductor circuit solder bump connectors 4104C–4104E and integrated circuit solder bumps 4102C–4102E, respectively. Lead 5034 couples together inductor circuit solder bump connectors 4104C and 4104E. Note that inductive loop circuits 4208 and 4210 couple together electrically in parallel because of the coupling through lead 5034 and because one terminal of each of conductive inductor circuit connection feature segments 4206A and 4206B couple to each other and to lead 5032. Lead 5032 couples to the inductor circuit solder bump connector 4104D. Leads 5032 and 5034 may constitute any suitable coupling, such as circuit traces or conductive material in conjunction with vias, as desired. Inputs of a differential amplifier (not shown explicitly) may couple to leads 5032 and 5034. Note that inductive loop circuits 4208 and 4210 share inductor circuit substrate bonding pad 4204D, integrated circuit solder bump 4102D, and inductor circuit solder bump connector 4104D.

Persons of ordinary skill who have the benefit of the description of the invention understand that the embodiments described above are exemplary only, and that one induction loop circuit, or more than two induction loop circuits, may be similarly formed with alternative substrate inductor circuit bonding pads in the manner as shown in the figures. Furthermore, the number and positioning of substrate inductor circuit bonding pads, integrated circuit inductor circuit solder bumps and/or the number and positioning of inductor circuit connective features connected between respective substrate inductor circuit bonding pads may be varied in a variety of ways as desired to achieve particular combinations of inductance characteristics.

As with other embodiments described herein, multiple induction loop circuits, such as induction loop circuits 4208 and 4210, may be connected to a single VCO circuit (e.g., with a switch in the integrated circuit for selecting either induction loop circuit), or may be connected to separate respective VCO circuits within integrated circuit 4100. Furthermore, multiple induction loop circuits such as induction loop circuits 4208 and 4210 may be connected in series or parallel to one or more VCO integrated circuits within integrated circuit 4100. Thus, it will be understood with the benefit of this disclosure, that many combinations of one or more VCO circuits within an integrated circuit 4100 may be switchably or unswitchably connected to one or more induction loop circuits formed within a package substrate 4200, and that substrate inductor circuit bonding pads, inductor circuit solder bumps, and/or inductor circuit connective features may be varied widely in number, geometry, material, spacing, etc. by those of skill in the art to achieve desired selectable inductance values.

Persons of ordinary skill who have the benefit of the description of the invention understand that one may vary inductance in conjunction with the embodiments disclosed herein using any parameter (geometry, length, material selection, etc.) that is suitable for varying the inductance value of an induction loop circuit or any portion thereof. For example, in the embodiment illustrated in FIG. 7A, the spacing or distance between a pair of inductor circuit wirebonds 3206a and 3206b may be varied (for example, by varying the distance between corresponding substrate inductor circuit bonding pads 3204a and 3204b), to achieve desired changes in inductance value of induction loop circuit 3208.

Although shown herein with respect to a voltage controlled oscillator, it will be recognized that the concepts of the present invention may be utilized with other controlled oscillators and any other type of circuit incorporating inductance values. Thus, for example, the present invention may be utilized with a current controlled oscillator. Furthermore, various circuits and techniques shown herein may be utilized separately or in combination without requiring the use of all circuits and techniques shown herein. Thus, aspects or the digital control may be utilized independent of aspects of the analog control and vice-versa. Moreover, some concepts shown herein may be utilized in applications different from the wireless communications embodiments discussed.

FIGS. 20–23 show induction loop circuit that each includes one conductive inductor circuit connection feature segment. One, however, may use induction loop circuits that use more than one conductive inductor circuit connection feature segment, as persons of ordinary skill in the art who have the benefit of the description of the invention understand. Furthermore, one may couple the conductive inductor circuit connection feature segments and/or combinations of conductive inductor circuit connection feature segments to provide arbitrary inductor circuit arrangements (including multi-element symmetrical parallel inductors), as desired.

As described above, one may include in the embodiments shown in FIGS. 20–23 one or more sets of alternative package substrate inductor circuit bonding pads to realize a wide variety of induction loop circuits, conductive inductor circuit connection feature segments, and/or arbitrary inductor circuit arrangements, as desired. Furthermore, one may apply to the embodiments described with respect to FIGS. 16–23 one or more of the variations and modifications presented in connection with other embodiments, such as those shown in FIGS. 5–11. Such variations and modifications include use of different materials and compositions, package types, lengths, sizes, loop areas, and geometries of wire bonds and other features of the in-package inductor circuits, etc.

Furthermore, as persons skilled in the art who have the benefit of the description of the invention appreciate, generally the more symmetrical one makes the physical arrangement and implementation of the parallel inductors, the more the resulting parallel inductors tend to reduce the effects of the undesired interference. For example, by using parallel inductors that have substantially the same inductance, loop area, resistance, parasitic element values (e.g., parasitic capacitance), material, and geometry, one may improve the rejection of undesired interference.

To further improve the symmetry between the parallel inductors, one may use as symmetrical of an arrangement, configuration, materials, geometry, and the like, of leads 5032 and 5034, as possible in a given application. For example, one may use overlapping circuit traces on two metal layers of an integrated circuit and connections through vias to implement symmetric leads that couple the inductors in parallel and to the differential amplifier. Of course, depending on the application, one may use other implementations of the leads, as persons of ordinary skill in the art who have the benefit of the description of the invention understand.

In addition, further modifications and alternative embodiments of this invention will be apparent to those skilled in the art in view of this description. For example, the use of n-channel and p-channel devices and associated logic levels are shown as example arrangements of device types, and it will be recognized that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size and arrangement of parts. For example, equivalent elements may be substituted for those illustrated and described herein, and certain features of the invention may be utilized independently of the use of other features, all as would be apparent to one skilled in the art after having the benefit of the description of the invention.

We claim:

1. A semiconductor package comprising:
  a package substrate having a first surface;
  an integrated circuit electrically connected to said package substrate, said integrated circuit and said package substrate together forming said semiconductor package, the integrated circuit and package substrate including frequency synthesizer circuitry;
  at least one inductance circuit formed entirely within said semiconductor package and formed at least partially between said integrated circuit and said package substrate, the inductance circuit at least in part determining an output frequency for the frequency synthesizer circuitry; and
  at least a first substrate electrical contact disposed on said package substrate and at least a second substrate electrical contact disposed on said package substrate,
  wherein said inductance circuit is formed at least in part by a first conductive feature electrically coupled between said integrated circuit and said first substrate electrical contact and a second conductive feature electrically coupled between said integrated circuit and said second substrate electrical contact,
  wherein said first substrate electrical contact and said second substrate electrical contact being electrically coupled by a third conductive feature, and
  wherein said first, second and third electrical features form an electrically conductive path.

2. The semiconductor package of claim 1, wherein the first and second conductive features are wirebonds.

3. The semiconductor package of claim 1, wherein the first and second conductive features are solder bumps.

4. The semiconductor package of claim 1, wherein said third conductive feature is a feature of said substrate.

5. The semiconductor package of claim 1, wherein said third conductive feature is a feature in said substrate.

6. The semiconductor package of claim 1, wherein said third conductive feature is a portion of said substrate.

7. The semiconductor package of claim 1, wherein the substrate is a bonding pad lead.

8. The semiconductor package of claim 1, wherein the substrate is a lead frame structure.

9. The semiconductor package of claim 1, wherein said frequency synthesizer circuitry has an output frequency selectably operable within one frequency band.

10. The semiconductor package of claim 1, wherein said frequency synthesizer circuitry has an output frequency selectably operable within a plurality of frequency bands.

11. The semiconductor package of claim 1, wherein a first inductor circuit bonding pad is connected to a second inductor circuit bonding pad with a third conductive inductor circuit connection feature to complete an induction loop circuit.

12. The semiconductor package of claim 11, wherein said third conductive inductor circuit connection feature is constructed of same material as said first and second inductor circuit bonding pads.

13. The semiconductor package of claim 12, wherein varying any one of geometry, length, and material selection of inductive connective features impacts inductance value between alternative selected pairs of substrate inductor circuit bonding pads.

14. The semiconductor package of claim 12, wherein inductance is impacted by spacing between said first and second conductive features.

15. The semiconductor package of claim 12, wherein inductance is impacted by size of said third conductive feature.

16. A frequency synthesizer for generating output signals in at least one band of frequency, comprising:
 a package substrate having a plurality of substrate electrical contacts;
 an integrated circuit connected to said package substrate and having a plurality of integrated circuit electrical contacts;
 a frequency synthesizer circuit having a variable output frequency, the frequency synthesizer circuit including a controlled oscillator circuit within a phase locked loop circuit; and
 at least one inductance circuit formed at least partially between said integrated circuit and said package substrate, said at least one inductance circuit providing at least a portion of an on-package inductor, the on-package inductor providing an inductance value for use with the controlled osciltator circuit, the inductance circuit comprising:
 at least a first substrate electrical contact disposed on said package substrate and at least a second substrate electrical contact disposed on said package substrate, and
 a third substrate conductive feature electrically coupling the first substrate electrical contact and the second substrate electrical contact,
 wherein said inductance circuit is formed at least in part by a first conductive feature electrically coupled between said integrated circuit and said first substrate electrical contact and a second conductive feature electrically coupled between said integrated circuit and said second substrate electrical contact, and
 wherein said first, second and third electrical features form an electrically conductive path of at least a portion of said inductance circuit.

17. The frequency synthesizer of claim 16, wherein said third conductive feature is a feature of said substrate.

18. The frequency synthesizer of claim 16, wherein said third conductive feature is a feature in said substrate.

19. The frequency synthesizer of claim 16, wherein said third conductive feature is a portion of said substrate.

20. The frequency synthesizer of claim 16, wherein the substrate is a bonding pad lead.

21. The frequency synthesizer of claim 16, wherein said frequency synthesizer circuitry has an output frequency selectably operable within one frequency band.

22. The frequency synthesizer of claim 16, wherein said frequency synthesizer circuitry has an output frequency selectably operable within a plurality of frequency bands.

23. The frequency synthesizer of claim 16, wherein a first inductor circuit bonding pad is connected to a second inductor circuit bonding pad with a third conductive inductor circuit connection feature to complete an induction loop circuit.

24. The frequency synthesizer of claim 23, wherein said third conductive inductor circuit connection feature is constructed of same material as said first and second inductor circuit bonding pads.

25. The frequency synthesizer of claim 24, wherein varying any one of geometry, length, and material selection of inductive connective features impacts inductance value between alternative selected pairs of substrate inductor circuit bonding pads.

* * * * *